United States Patent
Lazarus et al.

(10) Patent No.: US 12,105,175 B2
(45) Date of Patent: *Oct. 1, 2024

(54) ARTEFACT REDUCTION IN MAGNETIC RESONANCE IMAGING

(71) Applicant: Hyperfine Operations, Inc., Guilford, CT (US)

(72) Inventors: Carole Lazarus, Paris (FR); Rafael O'Halloran, Guilford, CT (US); Hadrien A. Dyvorne, New York, NY (US)

(73) Assignee: Hyperfine Operations, Inc., Guilford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/333,358

(22) Filed: Jun. 12, 2023

(65) Prior Publication Data

US 2023/0341494 A1    Oct. 26, 2023

Related U.S. Application Data

(63) Continuation of application No. 17/078,788, filed on Oct. 23, 2020, now Pat. No. 11,714,151.

(Continued)

(51) Int. Cl.
*G01R 33/565* (2006.01)
*G01R 33/36* (2006.01)
(Continued)

(52) U.S. Cl.
CPC ............ *G01R 33/56509* (2013.01); *G01R 33/3628* (2013.01); *G01R 33/4818* (2013.01);
(Continued)

(58) Field of Classification Search
CPC .......... G01R 33/56518; G01R 33/5611; G01R 33/5608; G01R 33/4822; G01R 33/4818;
(Continued)

(56) References Cited

U.S. PATENT DOCUMENTS 6,393,313 B1    5/2002 Foo
9,541,616 B2    1/2017 Rothberg et al.
(Continued)

FOREIGN PATENT DOCUMENTS

WO    WO-2014/118559 A1    8/2014

OTHER PUBLICATIONS

International Preliminary Report on Patentability for International Application No. PCT/US2020/057027 mailed May 5, 2022.
(Continued)

*Primary Examiner* — Gregory H Curran
(74) *Attorney, Agent, or Firm* — Foley & Lardner LLP

(57) ABSTRACT

Techniques of prospectively compensating for motion of a subject being imaged by an MRI system, the MRI system comprising a plurality of magnetics components including at least one gradient coil and at least one radio-frequency (RF) coil, the techniques comprising: obtaining first spatial frequency data and second spatial frequency data by operating the MRI system in accordance with a pulse sequence, wherein the pulse sequence is associated with a sampling path that includes at least two non-contiguous portions each for sampling a central region of k-space; determining a transformation using a first image obtained using the first spatial frequency data and a second image obtained using the second spatial frequency data; correcting the pulse sequence using the determined transformation to obtain a corrected pulse sequence; and obtaining additional spatial frequency data in accordance with the corrected pulse sequence.

20 Claims, 21 Drawing Sheets

Related U.S. Application Data

(60) Provisional application No. 62/925,924, filed on Oct. 25, 2019.

(51) Int. Cl.
  *G01R 33/48* (2006.01)
  *G01R 33/56* (2006.01)
  *G01R 33/561* (2006.01)
  *G06T 11/00* (2006.01)

(52) U.S. Cl.
  CPC ..... *G01R 33/4822* (2013.01); *G01R 33/5608* (2013.01); *G01R 33/5611* (2013.01); *G01R 33/56518* (2013.01); *G06T 11/006* (2013.01); *G06T 11/008* (2013.01)

(58) Field of Classification Search
  CPC .......... G01R 33/3628; G01R 33/56509; G06T 11/006; G06T 11/008
  See application file for complete search history.

(56) References Cited

U.S. PATENT DOCUMENTS

| | | |
|---|---|---|
| 9,547,057 B2 | 1/2017 | Rearick et al. |
| 9,625,544 B2 | 4/2017 | Poole et al. |
| 9,645,210 B2 | 5/2017 | Mcnulty et al. |
| 9,817,093 B2 | 11/2017 | Rothberg et al. |
| 10,145,913 B2 | 12/2018 | Hugon et al. |
| 10,145,922 B2 | 12/2018 | Rothberg et al. |
| 10,222,434 B2 | 3/2019 | Poole et al. |
| 10,274,561 B2 | 4/2019 | Poole et al. |
| 10,281,540 B2 | 5/2019 | Mileski et al. |
| 10,281,541 B2 | 5/2019 | Poole et al. |
| 10,310,037 B2 | 6/2019 | Mcnulty et al. |
| 10,416,264 B2 | 9/2019 | Sofka et al. |
| 10,551,452 B2 | 2/2020 | Rearick et al. |
| 10,591,561 B2 | 3/2020 | Sacolick et al. |
| 10,709,387 B2 | 7/2020 | Poole et al. |
| 2002/0190714 A1 | 12/2002 | Bernstein |
| 2003/0220560 A1 | 11/2003 | Kuehn |
| 2007/0063701 A1 | 3/2007 | Vu |
| 2007/0103155 A1 | 5/2007 | Tsekos et al. |
| 2008/0272782 A1 | 11/2008 | Lin |
| 2009/0285463 A1 | 11/2009 | Otazo et al. |
| 2010/0052681 A1 | 3/2010 | Saranathan et al. |
| 2010/0117644 A1 | 5/2010 | Nimbargi et al. |
| 2010/0232493 A1 | 9/2010 | Thirumoorthy |
| 2011/0105884 A1 | 5/2011 | Beck |
| 2014/0266195 A1 | 9/2014 | Levin |
| 2016/0025829 A1 | 1/2016 | Koktzoglou et al. |
| 2016/0061924 A1 | 3/2016 | Pipe |
| 2016/0128592 A1 | 5/2016 | Rosen et al. |
| 2017/0010340 A1 | 1/2017 | Eichner et al. |
| 2018/0089826 A1 | 3/2018 | Zhang et al. |
| 2018/0120401 A1 | 5/2018 | Shin et al. |
| 2019/0324098 A1 | 10/2019 | Mcnulty et al. |
| 2019/0353723 A1 | 11/2019 | Dyvorne et al. |
| 2019/0353726 A1 | 11/2019 | Poole et al. |
| 2020/0022611 A1 | 1/2020 | Nelson et al. |
| 2020/0022612 A1 | 1/2020 | Mcnulty et al. |
| 2020/0034998 A1 | 1/2020 | Schlemper et al. |
| 2020/0041588 A1 | 2/2020 | O'Halloran et al. |
| 2020/0045112 A1 | 2/2020 | Sacolick et al. |
| 2020/0058106 A1 | 2/2020 | Lazarus et al. |
| 2020/0200844 A1 | 6/2020 | Boskamp et al. |
| 2020/0209334 A1 | 7/2020 | O'Halloran et al. |
| 2020/0278413 A1 | 9/2020 | Kutsuna et al. |
| 2020/0289019 A1 | 9/2020 | Schlemper et al. |
| 2020/0289022 A1 | 9/2020 | Coumans et al. |
| 2020/0294229 A1 | 9/2020 | Schlemper et al. |
| 2020/0294282 A1 | 9/2020 | Schlemper et al. |
| 2020/0294287 A1 | 9/2020 | Schlemper et al. |
| 2020/0337587 A1 | 10/2020 | Sacolick et al. |
| 2020/0355765 A1 | 11/2020 | Chen et al. |
| 2021/0048498 A1 | 2/2021 | Dyvorne et al. |
| 2021/0123998 A1 | 4/2021 | Lazarus et al. |
| 2021/0124002 A1 | 4/2021 | Lazarus |
| 2021/0124003 A1 | 4/2021 | Lazarus et al. |

OTHER PUBLICATIONS

International Search Report and Written Opinion for International Application No. PCT/US2020/057027 mailed Apr. 22, 2021.

Invitation to Pay Additional Fees for International Application No. PCT/US2020/057027 mailed Feb. 18, 2021.

Pipe, Motion correction with Propeller MRI: application to head motion and free-breathing cardiac imaging. Magnetic Resonance in Medicine: An Official Journal of the International Society for Magnetic Resonance in Medicine. Nov. 1999;42(5):963-9.

Pruessmann et al., Advances in sensitivity encoding with arbitrary k-space trajectories. Magnetic Resonance in Medicine: An Official Journal of the International Society for Magnetic Resonance in Medicine. Oct. 2001;46(4):638-51.

Rashid et al., Cardiac balanced steady-state free precession MRI at 0.35 T: a comparison study with 1.5 T. Quantitative imaging in medicine and surgery. Aug. 2018;8(7):627-636.

Winkelmann et al., An optimal radial profile order based on the Golden Ratio for time-resolved MRI. IEEE transactions on medical imaging. Dec. 26, 2006;26(1):68-76.

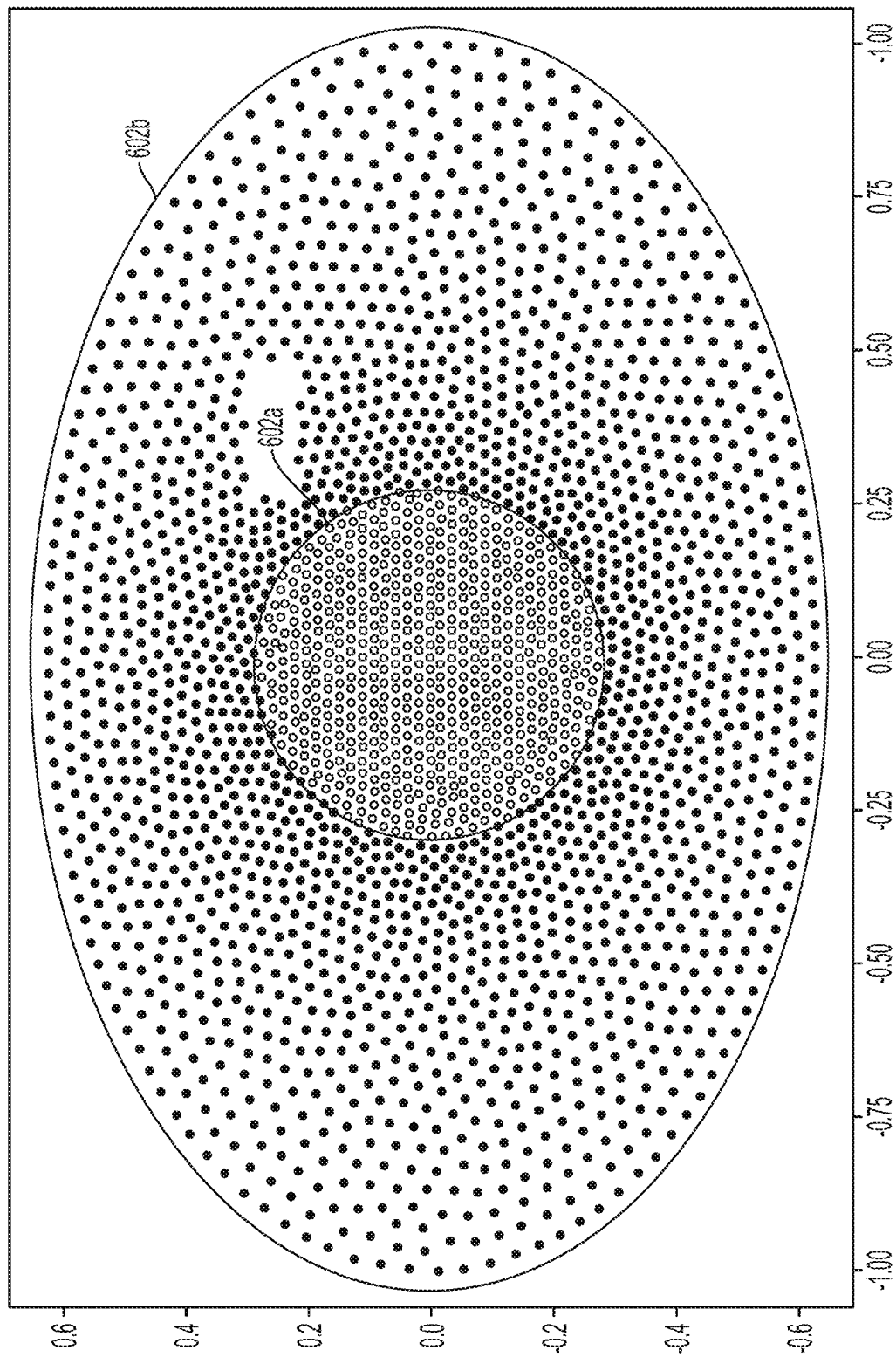

ARTEFACT REDUCTION IN MAGNETIC RESONANCE IMAGING

CROSS REFERENCE TO RELATED APPLICATIONS

This application is a continuation of U.S. patent application Ser. No. 17/078,788 filed Oct. 23, 2020, which claims priority to U.S. Provisional Patent Application No. 62/925,924 titled "SELF-NAVIGATED SAMPLING TRAJECTORIES FOR ARTIFACT REDUCTION IN MAGNETIC RESONANCE IMAGING SEQUENCES," and filed Oct. 25, 2019, each of which is incorporated by reference in its entirety herein.

FIELD

The present application relates generally to magnetic resonance imaging (MRI) and, more specifically, to techniques for reducing artefacts in magnetic resonance images resulting from eddy currents and/or movement of the subject during imaging.

BACKGROUND

MRI provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject to ionizing radiation, e.g., x-rays, or introducing radioactive material to the body). Additionally, MRI is particularly well suited to provide soft tissue contrast, which can be exploited to image subject matter that other imaging modalities are incapable of satisfactorily imaging. Moreover, MR techniques are capable of capturing information about structures and/or biological processes that other modalities are incapable of acquiring. However, there are a number of drawbacks to MRI that, for a given imaging application, may involve the relatively high cost of the equipment, limited availability (e.g., difficulty in gaining access to clinical MRI scanners) and/or the length of the image acquisition process.

The trend in clinical MRI has been to increase the field strength of MRI scanners to improve one or more of scan time, image resolution, and image contrast, which, in turn, continues to drive up costs. The vast majority of installed MRI scanners operate at 1.5 or 3 tesla (T), which refers to the field strength of the main magnetic field $B_0$. A rough cost estimate for a clinical MRI scanner is approximately one million dollars per tesla, which does not factor in the substantial operation, service, and maintenance costs involved in operating such MRI scanners.

These high-field MRI systems typically require large superconducting magnets and associated electronics to generate a strong uniform static magnetic field ($B_0$) in which an object (e.g., a patient) is imaged. The size of such systems is considerable with a typical high-field MRI installment including multiple rooms for the magnet, electronics, thermal management system, and control console areas. The size and expense of high-field MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but due to one or more of the limitations discussed above, is not practical or is impossible, as discussed in further detail below.

SUMMARY

Some embodiments are directed to a method of operating a low-field magnetic resonance imaging (MRI) system, the method comprising: obtaining an initial set of k-space phase-encoding coordinates; generating a sampling path through at least some of the k-space phase-encoding coordinates in the initial set to mitigate impact of eddy currents on operation of the low-field MRI system; and operating the low-field MRI system using a pulse sequence in accordance with the sampling path to obtain spatial frequency data for generating one or more magnetic resonance (MR) images of a subject.

In some embodiments, generating the sampling path comprises generating the sampling path such that substantially all k-space phase-encoding coordinates, which are neighboring along the generated sampling path, are within a threshold distance of one another, wherein the threshold distance depends on a Nyquist spatial frequency for the low-field MRI system. In some embodiments, generating the sampling path comprises generating the sampling path such that at least 95% of k-space phase-encoding coordinates, which are neighboring along the generated sampling path, are within a threshold distance of one another, wherein the threshold distance depends on a Nyquist spatial frequency for the low-field MRI system. In some embodiments, wherein generating the sampling path comprises generating the sampling path such that at least 99% of k-space phase-encoding coordinates, which are neighboring along the generated sampling path, are within a threshold distance of one another, wherein the threshold distance depends on a Nyquist spatial frequency for the low-field MRI system. In some embodiments, generating the sampling path comprises generating the sampling path such that all of k-space phase-encoding coordinates, which are neighboring along the generated sampling path, are within a threshold distance of one another, wherein the threshold distance depends on a Nyquist spatial frequency for the low-field MRI system.

In some embodiments, the threshold distance is less than or equal to C/FOV, wherein $1 \leq C \leq 5$ and FOV represents a length of an imaging field of view of the low-field MRI system along a given direction.

In some embodiments, generating the sampling path comprises: grouping the initial set of k-space phase encoding coordinates into a plurality of k-space sectors; determining a sequence of k-space sectors, each k-space sector in the sequence being selected from among the plurality of k-space sectors; and generating the sampling path in accordance with the sequence of k-space sectors.

In some embodiments, the sequence of k-space sectors includes at least one of the plurality of k-space sectors multiple times.

In some embodiments, generating the sampling path in accordance with the sequence of k-space sectors comprises: generating a plurality of sector sub-paths corresponding to the plurality of k-space sectors; generating a plurality of transition sub-paths for transitioning among the plurality of k-space sectors; and generating the sampling path from the plurality of sector sub-paths and the plurality of transition sub-paths.

In some embodiments, generating the plurality of transition sub-paths comprises selecting neighboring k-space phase-encoding coordinates along the transition sub-paths to be within a threshold distance of one another, wherein the threshold distance depends on a Nyquist spatial frequency for the low-field MRI system.

In some embodiments, the generated sampling path comprises one or more spiral sub-paths, and wherein the generated sampling path traverses k-space phase-encoding coordinates grouped in concentric k-space sectors. In some embodiments, the generated sampling path traverses k-space phase encoding coordinates in a sequence of radial k-space sectors. In some embodiments, at least some consecutive radial sectors in the sequence of radial k-space sectors are angled by approximately a golden angle relative to one another in k-space. In some embodiments, the consecutive radial sectors include a first rectangular band sector and a second rectangular band sector separated by approximately the golden angle relative to the first rectangular band sector.

In some embodiments, the pulse sequence is a diffusion weighted imaging (DWI) sequence. In some embodiments, the pulse sequence is a fast spin echo (FSE) sequence. In some embodiments, the pulse sequence is a steady state free precession (SSFP) sequence.

In some embodiments, the generated sampling path includes at least some coordinates not in the initial set of k-space phase encoding coordinates.

In some embodiments, k-space comprises a central region and at least one region outside the central region, and the generated sampling path repeatedly samples the central region.

In some embodiments, the generated sampling path includes multiple non-contiguous sub-paths containing k-space phase-encoding coordinates in the central region. In some embodiments, the central region of k-space is a region located entirely within a threshold distance of an origin of k-space. In some embodiments, the central region comprises a two-dimensional (2D) elliptical, circular, rectangular, and/or square region that includes an origin of k-space.

In some embodiments, the spatial frequency data comprises keyhole spatial frequency data collected using phase-encoding gradients corresponding to coordinates in the multiple non-contiguous sub-paths, the method further comprising: correcting the spatial frequency data and/or the one or more MR images of the subject for motion artifacts by using the keyhole spatial frequency data.

In some embodiments, the method further comprises generating the one or more MR images using the spatial frequency data.

Some embodiments provide for a method comprising: obtaining an initial set of k-space phase-encoding coordinates; generating a sampling path through at least some of the k-space phase-encoding coordinates in the initial set to mitigate impact of eddy currents on operation of the low-field MRI system, the generating comprising: grouping the initial set of k-space phase encoding coordinates into a plurality of k-space sectors; determining a sequence of k-space sectors, each k-space sector in the sequence being selected from among the plurality of k-space sectors; and generating the sampling path in accordance with the sequence of k-space sectors. In some embodiments, the method further comprises operating the low-field MRI system using a pulse sequence in accordance with the sampling path to obtain spatial frequency data for generating one or more magnetic resonance (MR) images of a subject.

Some embodiments provide for a system, comprising: at least one computer hardware processor; and at least one non-transitory computer-readable storage medium, storing processor executable instructions that, when executed by the at least one computer hardware processor, cause the at least one computer hardware processor to perform a method comprising: obtaining an initial set of k-space phase-encoding coordinates; generating a sampling path through at least some of the k-space phase-encoding coordinates in the initial set to mitigate impact of eddy currents on operation of a low-field MRI system, the generating comprising: grouping the initial set of k-space phase encoding coordinates into a plurality of k-space sectors; determining a sequence of k-space sectors, each k-space sector in the sequence being selected from among the plurality of k-space sectors; and generating the sampling path in accordance with the sequence of k-space sectors.

Some embodiments provide for at least one non-transitory computer-readable storage medium, storing processor executable instructions that, when executed by at least one computer hardware processor, cause the at least one computer hardware processor to perform a method comprising: obtaining an initial set of k-space phase-encoding coordinates; generating a sampling path through at least some of the k-space phase-encoding coordinates in the initial set to mitigate impact of eddy currents on operation of a low-field MRI system, the generating comprising: grouping the initial set of k-space phase encoding coordinates into a plurality of k-space sectors; determining a sequence of k-space sectors, each k-space sector in the sequence being selected from among the plurality of k-space sectors; and generating the sampling path in accordance with the sequence of k-space sectors.

Some embodiments provide for a method for compensating magnetic resonance imaging (MRI) data for artefacts caused by motion of a subject being imaged, the method comprising using at least one computer hardware processor to perform: obtaining spatial frequency data obtained by using a magnetic resonance imaging (MRI) system to perform MRI on a patient, the spatial frequency data including first spatial frequency data and second spatial frequency data; determining a transformation using a first image obtained using the first spatial frequency data and a second image obtained using the second spatial frequency data; determining a residual spatial phase; correcting, using the transformation, second spatial frequency data and the residual spatial phase, to obtain corrected second spatial frequency data and a corrected residual spatial phase; and generating a magnetic resonance (MR) image using the corrected second spatial frequency data and the corrected residual spatial phase.

Some embodiments provide for at least one computer-readable storage medium storing processor-executable instructions that, when executed by at least one computer hardware processor, cause the at least one computer hardware processor to perform a method for compensating magnetic resonance imaging (MRI) data for artefacts caused by motion of a subject being imaged, the method comprising: obtaining spatial frequency data obtained by using a magnetic resonance imaging (MRI) system to perform MRI on a patient, the spatial frequency data including first spatial frequency data and second spatial frequency data; determining a transformation using a first image obtained using the first spatial frequency data and a second image obtained using the second spatial frequency data; determining a residual spatial phase using the first and second images; correcting, using the transformation, second spatial frequency data and the residual spatial phase, to obtain corrected second spatial frequency data and a corrected residual spatial phase; and generating a magnetic resonance (MR) image using the corrected second spatial frequency data and the corrected residual spatial phase.

Some embodiments provide for a system, comprising: at least one computer hardware processor; and at least one computer-readable storage medium storing processor-executable instructions that, when executed by the at least one computer hardware processor, cause the at least one computer hardware processor to perform a method for compensating magnetic resonance imaging (MRI) data for artefacts caused by motion of a subject being imaged, the method comprising: obtaining spatial frequency data obtained by using a magnetic resonance imaging (MRI) system to perform MRI on a patient, the spatial frequency data including first spatial frequency data and second spatial frequency data; determining a transformation using a first image obtained using the first spatial frequency data and a second image obtained using the second spatial frequency data; determining a residual spatial phase using the first and second images; correcting, using the transformation, second spatial frequency data and the residual spatial phase, to obtain corrected second spatial frequency data and a corrected residual spatial phase; and generating a magnetic resonance (MR) image using the corrected second spatial frequency data and the corrected residual spatial phase.

In some embodiments, generating the MR image comprises generating a corrected second image using the corrected second spatial frequency data and the corrected residual spatial phase; and generating the MR image by combining the first image and the corrected second image.

In some embodiments, generating the MR image comprises generating the MR image by using the first spatial frequency data, the corrected spatial frequency data, and the corrected residual phase.

In some embodiments, generating the MR image by using the first spatial frequency data, the corrected spatial frequency data, and the corrected residual phase is performed using an iterative reconstruction technique. In some embodiments, the iterative reconstruction technique comprises a conjugate gradient SENSE algorithm.

In some embodiments, the method further comprises determining a corrected coil map using the corrected residual phase. In some embodiments, determining the transformation comprises determining a rigid transformation using the first image and the second image. In some embodiments, the first spatial frequency data and the second spatial frequency data were each obtained by using a pulse sequence that repeatedly samples a central region of k-space. In some embodiments, determining the residual spatial phase comprises determining the residual spatial phase using an image generated from the spatial frequency data.

Some embodiments, provide for a method of prospectively compensating for motion of a subject being imaged by an MRI system, the MRI system comprising a plurality of magnetics components including at least one gradient coil and at least one radio-frequency (RF) coil, the method comprising: obtaining first spatial frequency data and second spatial frequency data by operating the MRI system in accordance with a pulse sequence, wherein the pulse sequence is associated with a sampling path that includes at least two non-contiguous portions each for sampling a central region of k-space; determining a transformation using a first image obtained using the first spatial frequency data and a second image obtained using the second spatial frequency data; correcting the pulse sequence using the determined transformation to obtain a corrected pulse sequence; and obtaining additional spatial frequency data in accordance with the corrected pulse sequence.

In some embodiments, the method further comprises generating at least one magnetic resonance (MR) image using the additional spatial frequency data.

In some embodiments, the central region of k-space is a region located entirely within a threshold distance of an origin of k-space. In some embodiments, the central region comprises a two-dimensional (2D) elliptical, circular, rectangular, and/or square region that includes an origin of k-space.

In some embodiments, the sampling path comprises multiple non-contiguous sub-paths containing k-space phase-encoding coordinates in the central region.

In some embodiments, the transformation is a rigid transformation. In some embodiments, the transformation comprises a rotation and a translation.

In some embodiments, the pulse sequence comprises a gradient waveform, correcting the pulse sequence comprises determining a corrected gradient waveform from the gradient waveform by using the determined transformation, and obtaining the additional spatial frequency data in accordance with the corrected pulse sequence comprises operating the MRI system in accordance with the corrected gradient waveform.

In some embodiments, the transformation comprises a rotation and wherein determining the corrected gradient waveform comprises applying the rotation to the gradient waveform.

In some embodiments, the transformation comprises a translation, and wherein correcting the pulse sequence comprises changing transmit frequency of the at least one RF coil and/or receive phase of the at least one RF coil.

In some embodiments, generating at least one magnetic resonance (MR) is performed using first spatial frequency data, the second spatial frequency data, and the additional spatial frequency data.

In some embodiments, generating the at least one magnetic resonance MR image is performed using an iterative reconstruction technique.

Some embodiments provide for a magnetic resonance imaging (MRI) system comprising: a plurality of magnetics components including: at least one gradient coil; and at least one RF coil; and at least one controller configured to perform: controlling the MRI system in accordance with an MRI sequence to obtain first spatial frequency data and second spatial frequency data, wherein the pulse sequence is associated with a sampling path that repeatedly samples a central region of k-space; determining a transformation using a first image obtained using the first spatial frequency data and a second image obtained using the second spatial frequency data; correcting the pulse sequence using the determined transformation to obtain a corrected pulse sequence; and controlling the MRI system to obtain additional spatial frequency data in accordance with the corrected pulse sequence.

In some embodiments, the at least one controller is further configured to perform generating at least one magnetic resonance (MR) image using the additional spatial frequency data.

Some embodiments provide for a method comprising: performing an initial sampling of space; dividing the initial sampling into a plurality of sectors; and selecting a desired succession of sectors that minimizes a distance between phase-encoding coordinates within a sector and between sectors.

Some embodiments provide for a system comprising at least one computer hardware processor; and at least one non-transitory computer readable storage medium storing processor-executable instructions that, when executed by the at least one computer hardware processor, cause the at least one computer hardware processor to perform a method comprising: performing an initial sampling of space; dividing the initial sampling into a plurality of sectors; and selecting a desired succession of sectors that minimizes a distance between phase-encoding coordinates within a sector and between sectors.

Some embodiments provide for at least one non-transitory computer readable storage medium storing processor-executable instructions that, when executed by at least one computer hardware processor, cause the at least one computer hardware processor to perform a method comprising: performing an initial sampling of space; dividing the initial sampling into a plurality of sectors; and selecting a desired succession of sectors that minimizes a distance between phase-encoding coordinates within a sector and between sectors.

In some embodiments, the method further comprises sampling a central region of the k-space multiple times using a sampling path through the desired succession of sectors.

In some embodiments, the plurality of sectors have a radial symmetry. In some embodiments, the plurality of sectors are propeller shaped.

In some embodiments, the method further comprises correcting for one or more of: motion drift, phase drift, and phase errors by using spatial frequency data collected using a sampling path through the desired succession of sectors, wherein the sampling path repeatedly samples a central region of k-space.

In some embodiments, the method further comprises performing a parallel imaging reconstruction by using spatial frequency data collected using a sampling path through the desired succession of sectors.

In some embodiments, the initial sampling of k-space comprises a plurality of phase-encoding two-dimensional coordinates.

BRIEF DESCRIPTION OF THE DRAWINGS

Various aspects and embodiments of the application will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIG. 6A illustrates an example of an initial set of phase-encoding coordinates, a central region of k-space, and an outer region of k-space complementary to the central region, in accordance with some embodiments of the technology described herein.

DETAILED DESCRIPTION

Figure 1:
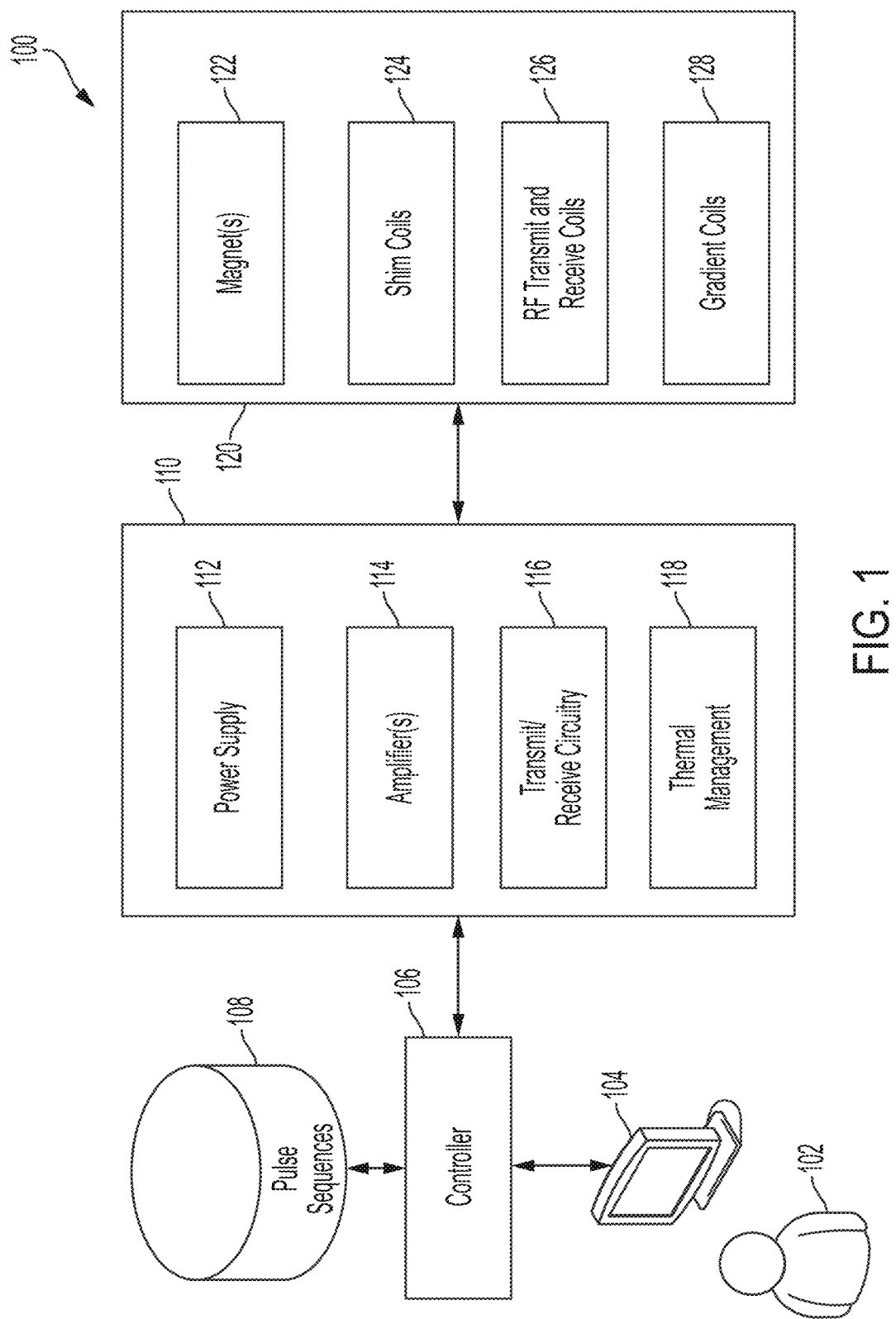
FIG. 1 illustrates exemplary components of a magnetic resonance imaging (MRI) system, in accordance with some embodiments of the technology described herein.

The MRI scanner market is overwhelmingly dominated by high-field systems. The appeal of high-field MRI systems includes improved resolution and/or reduced scan times compared to lower field systems, motivating the push for higher and higher field strengths for clinical and medical MRI applications. However, as discussed above, increasing the field strength of MRI systems yields increasingly more expensive and complex MRI scanners, thus limiting availability and preventing their use as a general purpose and/or generally available imaging solution.

Low-field MRI has been explored in limited contexts for non-imaging research purposes and specific contrast-enhanced imaging applications, but low-field MRI is conventionally regarded as being unsuitable for producing clinically useful images. For example, the resolution, contrast, and/or image acquisition time is generally not regarded as being suitable for clinical purposes such as, but not limited to, tissue differentiation, blood flow or perfusion imaging, diffusion-weighted (DW) or diffusion tensor (DT) imaging, functional MRI (fMRI), etc.

More recently, certain advancements (such as those developed by the Assignee of the instant application) have paved the way for improved quality, portability and/or lower-cost low-field MRI systems that can, in turn, enable wide-scale deployment of MRI technology in a variety of environments beyond the large MRI installments at hospitals and research facilities. As such, low-field MRI presents an attractive imaging solution, providing a relatively low cost, high availability alternative to high-field MRI. In particular, low-field MRI systems can be implemented as self-contained systems that are deployable in a wide variety of clinical settings where high-field MRI systems cannot, for example, by virtue of being transportable, cartable or otherwise generally mobile so as to be deployable where needed. As a result of this portability, such low-field MRI systems may be expected to operate in generally unshielded or partially shielded environments (e.g., outside of specially shielded rooms or encompassing cages) while also handling the particular noise environment in which they are deployed.

Consequently, the inventors have recognized that with the emergence of a new paradigm for MRI, certain additional challenges may arise with respect to a portable, point-of-care (POC) MRI system that can be installed in a variety of settings such as an emergency room, office or clinic. For example, one challenge with low-field MRI systems is that the signal-to-noise ratio (SNR) may be low, which may reduce the quality of resulting MRI images and may introduce undesirable artefacts into the images. Although it is possible to increase the SNR by repeated acquisitions (e.g., acquiring data from the same k-space coordinates multiple times and averaging the resulting acquisitions), doing so leads to longer acquisition times. However, longer acquisition times increase the likelihood that a patient moves during imaging and such motion will, in turn, degrade overall image quality.

This challenge arises in particular with respect to diffusion weighted imaging (DWI). DWI uses the diffusion of water molecules to generate contrast in MR images. DWI pulse sequences use strong diffusion gradients in certain directions in order to detect particles that diffuse in those directions. Because the mobility of water is driven by thermal agitation and is highly dependent on its cellular environment, the hypothesis behind DWI is that findings may indicate (early) pathologic change. Diffusion imaging is particularly useful in applications such as, for example, tumor characterization and detecting cerebral ischemia.

At low magnetic fields, the SNR of a DWI sequence is particularly low. Though repeated acquisitions may be averaged in order to increase the SNR for this specific imaging application, this leads to longer acquisition times (e.g., >5 minutes) as compared to standard high-field protocols. Increased acquisition times lead to the introduction of motion artefacts into the images and, because DWI sequences use large diffusion gradients, the effects of patient motion during imaging are exacerbated.

Another challenge with low-field MRI systems is that the gradient fields generated by an MRI system may induce eddy currents in the MRI system, which lead to the introduction artefacts in MR images generated by the system and contribute to further reducing the SNR, which may already be low due to the overall lower strength $B_0$ field.

In particular, an MRI system generates time-varying gradient magnetic fields to spatially encode MR signals within the subject as well as radio frequency (RF) signals to excite MR responses from spins within the subject. These time-varying electromagnetic fields can generate eddy currents within any conductive surfaces associated with the structure of the MRI system (e.g., metal plates, yoke, etc.). Eddy currents are electrical currents induced within conductors by a changing magnetic field experienced by the conductor. Because eddy currents flow in closed loops, they generate opposing magnetic fields and accordingly can interfere with the acquisition of MR images. Correcting for presence of eddy currents within an MRI system is important for producing high-quality MR images because spurious eddy currents modify encoding or signal content of the MR acquisition, leading to artefacts in the acquired MR images. This is especially the case in low-field MRI systems, which are vulnerable to the adverse effects of eddy currents because of the low signal-to-noise (SNR) of low-field MRI systems relative to conventional high-field MRI systems.

The inventors have developed techniques to address the above-described challenges with low-field MRI systems. First, the inventors have developed pulse sequences that mitigate (reduce or eliminate) the impact of eddy currents on operation of an MRI system by keeping the differences in amplitudes of consecutive phase-encoding gradients as small as possible. The inventors have recognized that reducing the size of amplitude differences of consecutive phase-encoding gradients, in turn, reduces the extent to which eddy currents are induced in the MRI system and improves overall performance (e.g., by increasing SNR and reducing the presence of eddy-current related artefacts in the resulting images).

To achieve this, the inventors have developed pulse sequences having a 2D sampling path in the phase-encoding plane and a set of parallel readout lines that are perpendicular to the phase encoding plane. The sampling path in the phase-encoding plane is designed to smoothly transition between consecutive k-space samples, so that the distance between consecutive k-space samples is kept within a short threshold distance, thereby minimizing eddy currents induced in the MRI system by gradient switching. Techniques for generating such sampling paths and using them to operate MRI systems are described herein including with reference to FIGS. 3A-B, FIGS. 4A-4C, 5A-5C, 6A-6B, and 7.

Second, the inventors have developed pulse sequences that repeatedly sample a central region (sometimes termed a "keyhole" region) of k-space and have developed both retrospective and prospective motion correction techniques to correct for a subject's motion using spatial frequency data obtained by repeatedly sampling the central region. Because data collected by the pulse sequence through repeatedly sampling the keyhole region may be used to correct for the subject's motion without reliance on external sensors, such a pulse sequence may be termed a "self-navigating" pulse sequence. Aspects of retrospective motion correction are described herein including with reference to FIGS. 8-10 and 11A-11K. Aspects of prospective motion correction are described herein including with reference to FIG. 12.

Accordingly, some embodiments provide for a method of operating a low-field magnetic resonance imaging (MRI) system, the method comprising: (1) obtaining an initial set of k-space phase-encoding coordinates (e.g., two-dimensional (2D) coordinates; (2) generating a sampling path through at least some of the k-space phase-encoding coordinates in the initial set to mitigate impact of eddy currents on operation of the low-field MRI system; and (3) operating the low-field MRI system using a pulse sequence in accordance with the sampling path to obtain spatial frequency data for generating one or more magnetic resonance (MR) images of a subject. In some embodiments, the spatial frequency data may be used to generate one or more MR images using any suitable reconstruction technique.

In some embodiments, a pulse sequence may indicate a sequence of gradient fields and RF pulses to be generated by an MRI system. In addition, the pulse sequence may indicate the timing when the gradient fields and RF pulses are to be generated by the MRI system. For example, the pulse sequence may indicate when the gradient coil(s) of an MRI system are to generate various phase encoding and/or frequency encoding gradients and the order in which such gradients are to be generated. In some embodiments, a pulse sequence specifies the order in which phase-encoding gradient pulses are to be generated via a sequence of 2D phase-encoding k-space coordinates, which sequence may be referred to as a "sampling path" through the phase-encoding plane.

As described above, the generated sampling path may mitigate the impact of eddy currents on operation of the low-field MRI system (thereby increasing the SNR of and mitigating (e.g., removing or reducing) the presence of artefacts in the generated images) when the sampling path smoothly transitions between consecutive k-space samples, so that the distance between consecutive k-space samples is kept within a short threshold distance, thereby minimizing eddy currents induced in the MRI system (e.g., in the ferromagnetic yoke of the MRI system shown in FIG. 2) by gradient switching. The threshold distance may be set with respect to the Nyquist spatial frequency for the MRI system, in some embodiments. The Nyquist spatial frequency is the inverse of the imaging field-of-view (FOV) for the low-field MRI system. Accordingly, in some embodiments, generating the sampling path comprises generating the sampling path such that at least a threshold percentage (e.g., at least 80%, at least 85%, at least 90%, at least 95%, at least 99%, substantially all, all) k-space phase-encoding coordinates, which are neighboring along the generated sampling path, are within a threshold distance of one another, where the threshold distance depends on a Nyquist spatial frequency for the low-field MRI system.

In some embodiments, the threshold distance may be less than or equal to C/FOV, where C is any real number in the range of $1 \leq C \leq 5$ (e.g., C=1, 1.5, 2, 2.5, 3, 3.5, 4, 4.5, 5, or any other suitable number between 1 and 5) and FOV represents a length of an imaging field of view of the low-field MRI system along a given direction. In some embodiments, the constant C may be any real number between 1 and 10 or between 1 and 20. In some embodiments, for example when the initial set of k-space phase encoding coordinates are oversampled related to the Nyquist spatial frequency, the constant C may be less than 1.

In some embodiments, generating the sampling path comprises: (a) grouping the initial set of k-space phase encoding coordinates into a plurality of k-space sectors; (b) determining a sequence of k-space sectors, each k-space sector in the sequence being selected from among the plurality of k-space sectors; and (c) generating the sampling path in accordance with the sequence of k-space sectors. A k-space sector refers to a group of k-space phase encoding coordinates.

In some embodiments, the sequence of k-space sectors includes at least one of the plurality of k-space sectors multiple times. For example, in some embodiments, the sequence of k-space sectors includes a "keyhole" sector in a central region of k-space multiple times. A sampling path generated in accordance with such a sequence of k-space sectors will repeatedly sample the central region of k-space (e.g., it will contain multiple non-contiguous sub-paths in the keyhole sector). In some embodiments, each of multiple sectors from the plurality of k-space sectors, may be repeated multiple times in the sequence of k-space sectors.

In some embodiments, generating the sampling path in accordance with the sequence of k-space sectors comprises: (a) generating a plurality of sector sub-paths corresponding to the plurality of k-space sectors; (b) generating a plurality of transition sub-paths for transitioning among the plurality of k-space sectors; and (c) generating the sampling path from the plurality of sector sub-paths and the plurality of transition sub-paths (e.g., by connecting the sub-paths and transition paths in accordance with the sequence of sectors).

In some embodiments, generating the plurality of transition sub-paths comprises selecting neighboring k-space phase-encoding coordinates along the transition sub-paths to be within a threshold distance of one another, wherein the threshold distance depends on a Nyquist spatial frequency for the low-field MRI system.

In some embodiments, the generated sampling path may be spiral and may include one or more spiral sub-paths. The spiral sampling path may traverse a sequence of concentric k-space sectors. An illustrative example of such a sampling path is described herein including with reference to FIGS. 4A-4C.

In some embodiments, the generated sampling path may traverse k-space phase encoding coordinates grouped in radial k-space sectors. In some embodiments, the radial k-space sectors include radial bands, for example, as described herein with reference to FIGS. 5A-5C. In some embodiments, the radial k-space sectors include radial spokes, for example, as described herein with reference to FIGS. 6A-6B.

In some embodiments, the sequence of k-space sectors includes a sequence of radial k-space sectors (e.g., radial bands, radial spokes), and at least some (e.g., all) pairs of consecutive radial k-space sectors are angled by approximately a golden angle relative to one another in k-space.

In some embodiments, the pulse sequence may be a diffusion weighted imaging (DWI) sequence. In some embodiments, operating an MRI system in accordance with a DWI pulse sequence may involve applying diffusion gradients prior to application of encoding gradients. Other aspects of a DWI pulse sequence may vary. For example, in some embodiments, the DWI pulse sequence may be a fast spin echo (FSE) DWI sequence. As another example, the DWI pulse sequence may be a steady-state free precession (SSFP) DWI sequence.

In some embodiments, the generated sampling path includes at least some coordinates not in the initial set of k-space phase encoding coordinates. For example, in some embodiments, one or more of the generated transition paths may include k-space phase encoding coordinates not part of the initial set of k-space phase encoding coordinates.

In some embodiments, k-space comprises a central region and at least one region outside the central region, and the generated sampling path repeatedly samples the central region. The central region may be referred to as a "keyhole region". In some embodiments, the generated sampling path repeatedly samples the central region by including multiple non-contiguous sub-paths containing k-space phase-encoding coordinates in the central region. Two sub-paths of a sampling path may be non-contiguous when there is at least one point not part of either of the two sub-paths and located between the two sub-paths along the sampling path.

In some embodiments, the central region of k-space is a region located entirely within a threshold distance of the origin of k-space. The central region may have any suitable shape. For example, in some embodiments, the central region may include a two-dimensional (2D) elliptical, circular, rectangular, and/or square region that includes an origin of k-space.

In some embodiments, the spatial frequency data comprises keyhole spatial frequency data collected using phase-encoding gradients corresponding to coordinates in the multiple non-contiguous sub-paths, the method further comprising: correcting the spatial frequency data and/or the one or more MR images of the subject for motion artefacts by using the keyhole spatial frequency data.

In some embodiments, the techniques developed by the inventors involve: (1) performing an initial sampling of k-space; (2) dividing the initial sampling into a plurality of sectors; and (3) selecting a desired succession of sectors that minimizes a distance between phase-encoding coordinates within a sector and between sectors. In some embodiments, the techniques further comprise sampling a central region of the k-space multiple times using a sampling path through the desired succession of sectors. For example, in some embodiments, an MRI system may be operated using a pulse sequence consistent with the sampling path. In some embodiments, the plurality of sectors has a radial symmetry. In some embodiments, the sectors are shaped as radial bands (which may be considered as "propeller blades").

In some embodiments, the techniques further involve correcting for one or more of: motion drift, phase drift, and phase errors by using spatial frequency data collected using a sampling path through the desired succession of sectors, wherein the sampling path repeatedly samples a central region of k-space. In some embodiments, the techniques further involve performing a parallel imaging reconstruction by using spatial frequency data collected using a sampling path through the desired succession of sectors.

It should be appreciated that various aspects described herein may be implemented in any of numerous ways. Examples of specific implementations are provided herein for illustrative purposes only. In addition, the various aspects described in the embodiments below may be used alone or in any combination and are not limited to the combinations described explicitly herein.

Magnetic Resonance Imaging Systems

As used herein, "high-field" refers generally to MRI systems presently in use in a clinical setting and, more particularly, to MRI systems operating with a $B_0$ field at or above 1.5 T, though clinical systems operating between 0.5 T and 1.5 T are typically also considered "high-field." By contrast, "low-field" refers generally to MRI systems operating with a $B_0$ field of less than or equal to approximately 0.2 T. Within the low-field regime, low-field MRI systems operating with $B_0$ field of less than 0.1 T are referred to herein as "very low-field" and low-field MRI systems operating with a $B_0$ field of less than 10 mT are referred to herein as "ultra low-field."

FIG. 1 illustrates exemplary components of a magnetic resonance imaging (MRI) system, in accordance with some embodiments. In the illustrative example of FIG. 1, MRI system 100 comprises computing device 104, controller 106, pulse sequences repository 108, power management system 110, and magnetics components 120. It should be appreciated that system 100 is illustrative and that an MRI system may have one or more other components of any suitable type in addition to or instead of the components illustrated in FIG. 1. However, an MRI system will generally include these high-level components, though the implementation of these components for a particular MRI system may differ. It should be appreciated that any pulse sequences and/or sampling paths developed using the techniques described herein (e.g., including with reference to FIGS. 3A-B, 4A-C, 5A-C, 6A-B, and 7), and/or any motion correction techniques described herein (including, for example, retrospective motion correction techniques described herein including with reference to FIGS. 10 and 11A-K, and prospective motion correction techniques described herein including with reference to FIG. 12) may be used with any suitable type of MRI systems including high-field MRI systems, low-field MRI systems, very low-field MRI systems, and ultra-low field MRI systems. For example, the techniques described herein may be used with any of the MRI systems described herein and/or as described in U.S. Pat. No. 10,627,464 filed Jun. 30, 2017 and titled "Low-Field Magnetic Resonance Imaging Methods and Apparatus," which is incorporated by reference herein in its entirety.

As illustrated in FIG. 1, magnetics components 120 comprise $B_0$ magnets 122, shims 124, radio frequency (RF) transmit and receive coils 126, and gradient coils 128. $B_0$ magnets 122 may be used to generate the main magnetic field $B_0$. $B_0$ magnets 122 may be any suitable type or combination of magnetics components that can generate a desired main magnetic $B_0$ field. In some embodiments, $B_0$ magnets 122 may be a permanent magnet, an electromagnet, a superconducting magnet, or a hybrid magnet comprising one or more permanent magnets and one or more electromagnets and/or one or more superconducting magnets. In some embodiments, $B_0$ magnets 122 may be configured to generate a $B_0$ magnetic field having a field strength that is less than or equal to 0.2 T or within a range from 50 mT to 0.1 T.

For example, in some embodiments, $B_0$ magnets 122 may include a first and second $B_0$ magnet, each of the first and second $B_0$ magnets including permanent magnet blocks arranged in concentric rings about a common center. The first and second $B_0$ magnet may be arranged in a bi-planar configuration such that the imaging region is located between the first and second $B_0$ magnets. In some embodiments, the first and second $B_0$ magnets may each be coupled to and supported by a ferromagnetic yoke configured to capture and direct magnetic flux from the first and second $B_0$ magnets. Additional details of such embodiments are described in U.S. Pat. No. 10,545,207 titled "Low-Field Magnetic Resonance Imaging Methods and Apparatus" filed on Apr. 18, 2018, which is incorporated by reference herein in its entirety.

In some embodiments, shims 124 may include one or more permanent magnet shims configured to generate a magnetic field to contribute to the $B_0$ magnetic field generated by $B_0$ magnets 122. Examples of permanent magnet shims are described in U.S. Pat. No. 10,613,168, titled "Methods and Apparatus for Magnetic Field Shimming," filed on Mar. 22, 2017, which is incorporated by reference herein in its entirety. Additionally or alternatively, in some embodiment, shims 124 may include one or more shim coils that are configured to generate, electromagnetically, a magnetic field to contribute to the $B_0$ magnetic field generated by $B_0$ magnets 122.

Gradient coils 128 may be arranged to provide gradient fields and, for example, may be arranged to generate gradients in the $B_0$ field in three substantially orthogonal directions (X, Y, Z). Gradient coils 128 may be configured to encode emitted MR signals by systematically varying the $B_0$ field (the $B_0$ field generated by $B_0$ magnets 122 and/or shims 124) to encode the spatial location of received MR signals as a function of frequency or phase. For example, gradient coils 128 may be configured to vary frequency or phase as a linear function of spatial location along a particular direction, although more complex spatial encoding profiles may also be provided by using nonlinear gradient coils. In some embodiments, gradient coils 128 may be implemented using laminate panels (e.g., printed circuit boards). Examples of such gradient coils are described in U.S. Pat. No. 9,817,093, titled "Low Field Magnetic Resonance Imaging Methods and Apparatus" filed on Sep. 4, 2015, which is incorporated by reference herein in its entirety.

MRI is performed by exciting and detecting emitted MR signals using transmit and receive coils, respectively (often referred to as radio frequency (RF) coils). Transmit/receive coils may include separate coils for transmitting and receiving, multiple coils for transmitting and/or receiving, or the same coils for transmitting and receiving. Thus, a transmit/receive component may include one or more RF coils for transmitting, one or more RF coils for receiving, and/or one or more RF coils for transmitting and receiving. Transmit/receive coils are also often referred to as Tx/Rx or Tx/Rx coils to generically refer to the various configurations for the transmit and receive magnetics component of an MRI system. These terms are used interchangeably herein. In FIG. 1, RF transmit and receive circuitry 116 comprises one or more RF transmit coils that may be used to generate RF pulses to induce an oscillating magnetic field $B_1$. The transmit coil(s) may be configured to generate any suitable types of RF pulses. The transmit and receive circuitry 116 may include additional electronic components of the transmit and receive chains, as described in U.S. Patent Application Publication No. 2019/0353723 titled "Radio-Frequency Coil Signal Chain for a Low-Field MRI System" and filed on May 21, 2019, which is hereby incorporated by reference in its entirety. For example, the transmit and receive circuitry 116 may include a transmit/receive switch, in some embodiments.

Power management system 110 includes electronics to provide operating power to one or more components of the low-field MRI system 100. For example, power management system 110 may include one or more power supplies, energy storage devices, gradient power components, transmit coil components, and/or any other suitable power electronics needed to provide suitable operating power to energize and operate components of MRI system 100. As illustrated in FIG. 1, power management system 110 comprises power supply system 112, power component(s) 114, transmit and receive circuitry 116, and thermal management components 118 (e.g., cryogenic cooling equipment for superconducting magnets, water cooling equipment for electromagnets). Power management system 110 may include one or more other components instead of or in addition to the components shown in FIG. 1.

Power supply system 112 includes electronics to provide operating power to magnetic components 120 of the MRI system 100. The electronics of power supply system 112 may provide, for example, operating power to one or more gradient coils (e.g., gradient coils 128) to generate one or more gradient magnetic fields to provide spatial encoding of the MR signals. Additionally, the electronics of power supply system 112 may provide operating power to one or more RF coils (e.g., RF transmit and receive coils 126) to generate and/or receive one or more RF signals from the subject. For example, power supply system 112 may include a power supply configured to provide power from mains electricity to the MRI system and/or an energy storage device. The power supply may, in some embodiments, be an AC-to-DC power supply configured to convert AC power from mains electricity into DC power for use by the MRI system. The energy storage device may, in some embodiments, be any one of a battery, a capacitor, an ultracapacitor, a flywheel, or any other suitable energy storage apparatus that may bidirectionally receive (e.g., store) power from mains electricity and supply power to the MRI system. Additionally, power supply system 112 may include additional power electronics encompassing components including, but not limited to, power converters, switches, buses, drivers, and any other suitable electronics for supplying the MRI system with power.

Amplifiers(s) 114 may include one or more RF receive (Rx) pre-amplifiers that amplify MR signals detected by one or more RF receive coils (e.g., coils 126), one or more RF transmit (Tx) power components configured to provide power to one or more RF transmit coils (e.g., coils 126), one or more gradient power components configured to provide power to one or more gradient coils (e.g., gradient coils 128), and one or more shim power components configured to provide power to one or more shim coils (e.g., in embodiments where shims 124 are implemented at least in part using shim coils). Transmit/receive switch 116 may be used to select whether RF transmit coils or RF receive coils are being operated.

As illustrated in FIG. 1, MRI system 100 includes controller 106 (also referred to as a console) having control electronics to send instructions to and receive information from power management system 110. Controller 106 may be configured to implement one or more pulse sequences, which are used to determine the instructions sent to power management system 110 to operate the magnetic components 120 in a desired sequence (e.g., parameters for operating the RF transmit and receive coils 126, parameters for operating gradient coils 128, etc.). As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information.

Computing device 104 may be any electronic device configured to process acquired MR data and generate one or more images of a subject being imaged. In some embodiments, computing device 104 may be located in a same room as the MRI system 100 and/or coupled to the MRI system 100. In some embodiments, computing device 104 may be a fixed electronic device such as a desktop computer, a server, a rack-mounted computer, or any other suitable fixed electronic device that may be configured to process MR data and generate one or more images of the subject being imaged. Alternatively, computing device 104 may be a portable device such as a smart phone, a personal digital assistant, a laptop computer, a tablet computer, or any other portable device that may be configured to process MR data and generate one or images of the subject being imaged. In some embodiments, computing device 104 may comprise multiple computing devices of any suitable type, as aspects of the disclosure provided herein are not limited in this respect.

Figure 2:
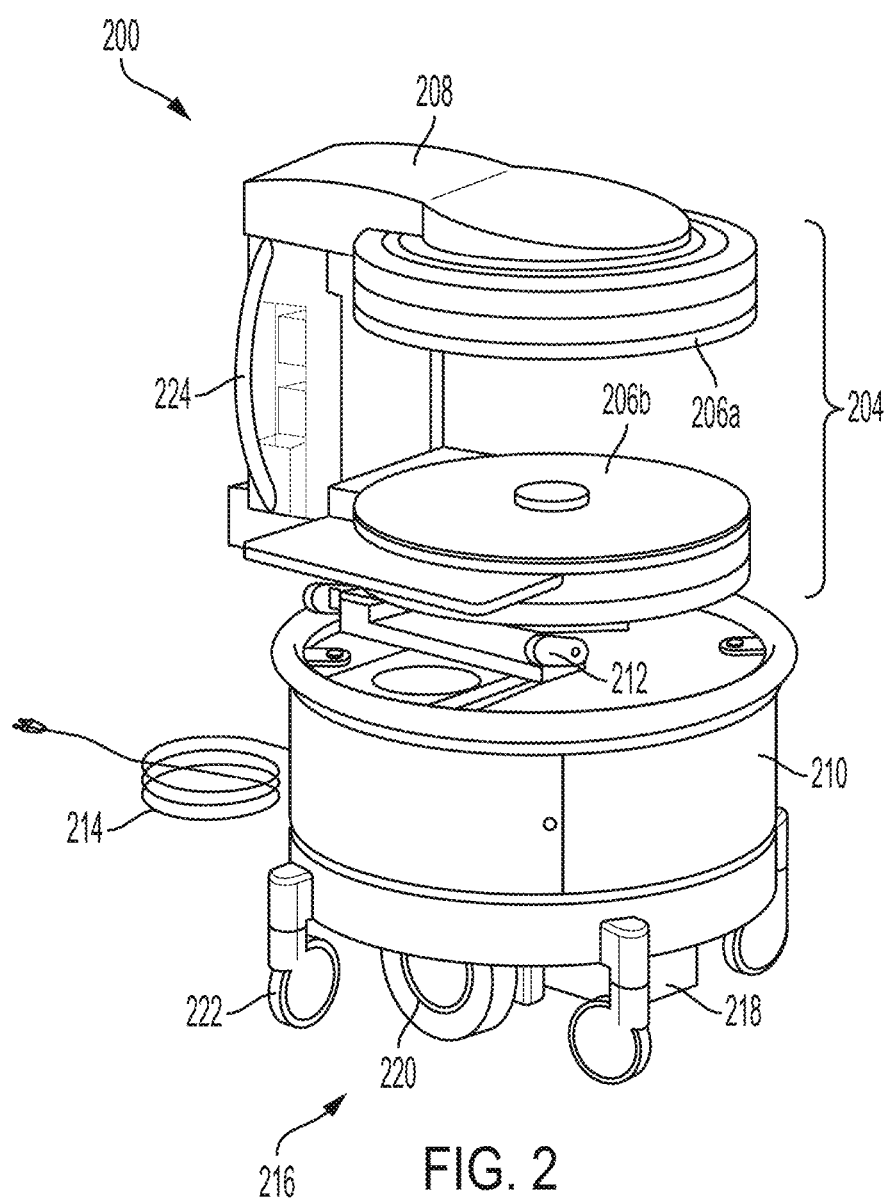
FIG. 2 illustrates an exemplary portable low-field magnetic resonance imaging system, which may be used in accordance with some embodiments of the technology described herein.

Referring now to FIG. 2, there is shown an exemplary portable magnetic resonance imaging MRI system 200, which may be used in accordance with embodiments of the disclosure. In the embodiment depicted in FIG. 2, the portable MRI system 200 is a point-of-care (POC) MRI system including a $B_0$ magnet 204 having at least one first permanent magnet 206a and at least one second permanent magnet 206b magnetically coupled to one another by a ferromagnetic yoke 208 configured to capture and channel magnetic flux to increase the magnetic flux density within the imaging region of the MRI system, which is located between the first and second permanent magnets 206a and 206b.

The $B_0$ magnet 204 may be coupled to or otherwise attached or mounted to a base 210 by a positioning mechanism 212 (e.g., a goniometric stage) so that the $B_0$ magnet can be tilted (e.g., rotated about its center of mass) to provide an incline to accommodate a patient's anatomy as needed. In addition to providing a load bearing structure(s) for supporting the $B_0$ magnet 204, the base 210 may also include an interior space or compartment(s) configured to house the electronics (not shown) used to operate the portable MRI system 200. For example, the base 210 may house power management components to operate gradient coils (e.g., X, Y and Z) and RF transmit/receive coils, as well as RF coil amplifiers (power amplifiers to operate the transmit/receive coils of the system), power supplies, console, power distribution unit and/or any other electronics for operating the MRI system 200.

In some embodiments, the electronics needed to operate portable MRI system 200 consume less than 1 kW of power and, in some embodiments, less than 750 W of power (e.g., MRI systems utilizing a permanent $B_0$ magnet solution). However, systems that consume greater power may also be utilized as well, as the aspects of the technology described herein are not limited in this respect. As such, the exemplary portable MRI system 200 may be powered via a single power connection 214 configured to connect to a source of mains electricity, such as an outlet providing single-phase power (e.g., a standard or large appliance outlet). Accordingly, the portable MRI system 200 can be plugged into a single available power outlet and operated therefrom.

As further illustrated in FIG. 2, the portable MRI system 200 may also include a conveyance mechanism 216 that allows the portable MRI system 200 to be transported to different locations. The conveyance mechanism 216 may include one or more components configured to facilitate movement of the portable MRI system 200, for example, to a location at which MRI is needed. According to some embodiments, conveyance mechanism 216 may include a motor 218 coupled to drive wheels 220. In this manner, the conveyance mechanism 216 provides motorized assistance in transporting the MRI system 200 to desired locations. Additionally, the conveyance mechanism 216 may also include a plurality of castors 222 to assist with support and stability as well as facilitating transport.

In some embodiments, the conveyance mechanism 216 may optionally include motorized assistance controlled via a joystick (not shown) to guide the portable MRI system 200 during transportation to desired locations. According to some embodiments, the conveyance mechanism 216 may also include a power assist mechanism configured to detect when force is applied to the MRI system, and in response engage the conveyance mechanism 216 to provide motorized assistance in the direction of the detected force. For example, handles 224 may be configured to detect when force is applied thereto the rail (e.g., by personnel pushing on the handles 224) and engage the conveyance mechanism 216 to provide motorized assistance to drive the wheels 220 in the direction of the applied force. As a result, a user can guide the portable MRI system 200 with the assistance of the conveyance mechanism 216 that responds to the direction of force applied by the user.

Mitigating Impact of Eddy Currents

As described above, the inventors have recognized that generation of eddy currents produced during the imaging of a subject by an MRI system introduces artefacts into images. These artefacts may be exacerbated in low-field MRI systems, which may substantially reduce image quality. The inventors have developed pulse sequences that mitigate the impact of eddy currents on operation of an MRI system by keeping the differences in amplitudes of consecutive phase-encoding gradients as small as possible. Techniques for generating such sampling paths and using them to operate MRI systems are described herein including in this section titled "Mitigating Impact of Eddy Currents".

Figure 3A:
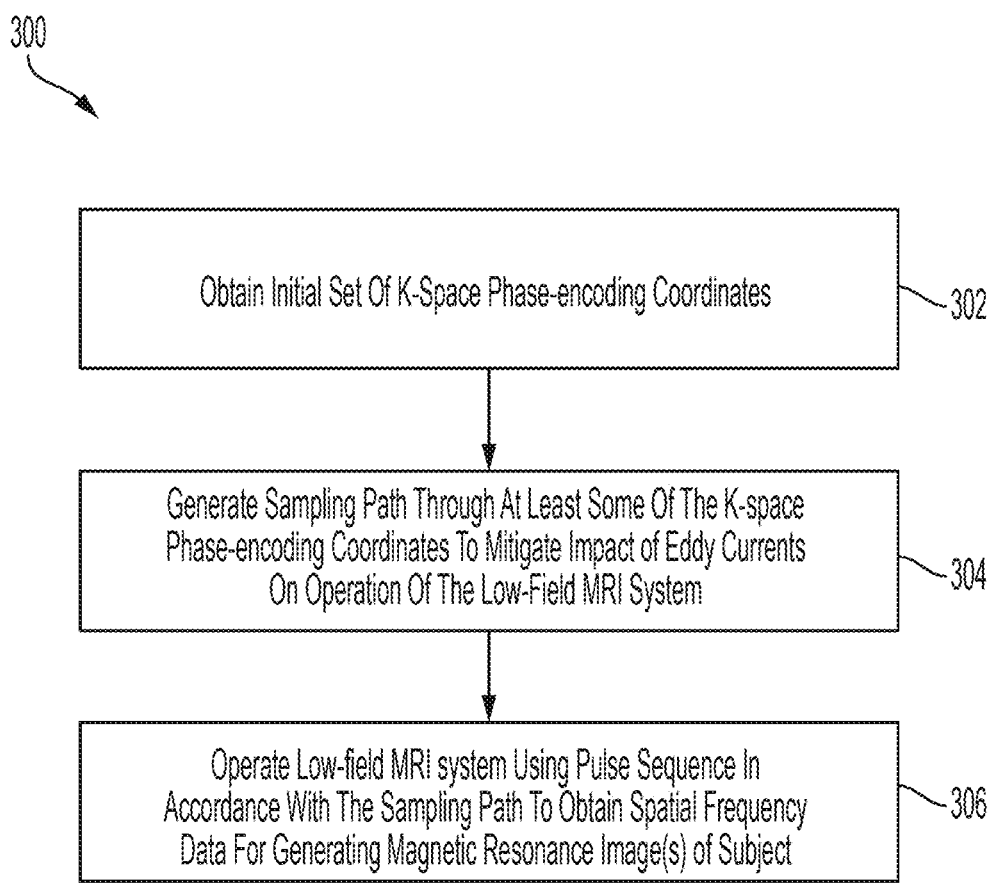
FIG. 3A is a flowchart of an illustrative process 300 for operating an MRI system in accordance with a sampling path that mitigates the impact of eddy currents on operation of the MRI system, in accordance with some embodiments of the technology described herein.

FIG. 3A is a flowchart of an illustrative process 300 for operating an MRI system in accordance with a sampling path that mitigates the impact of eddy currents on operation of the MRI system, in accordance with some embodiments of the technology described herein.

Figure 4A:
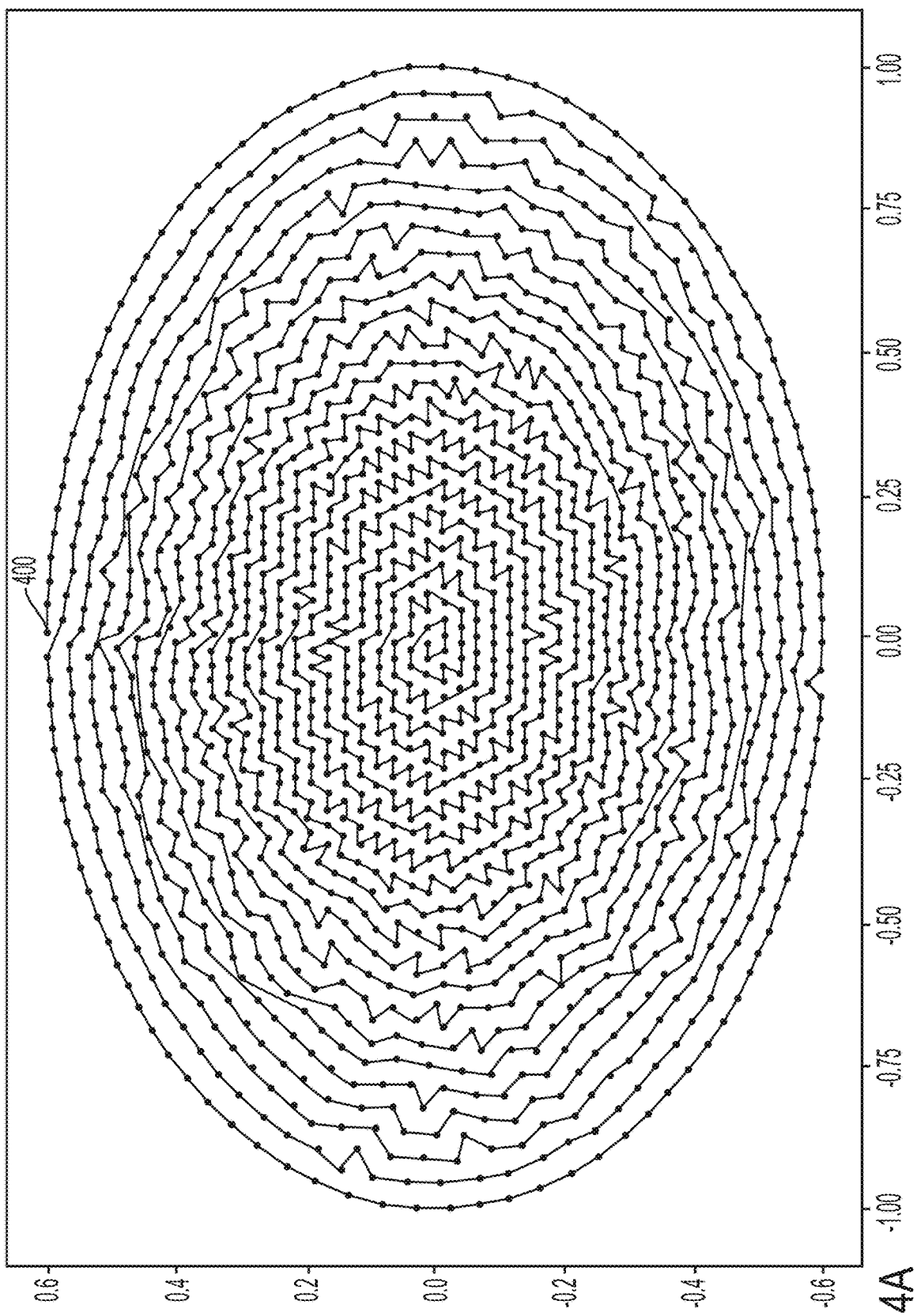
FIG. 4A illustrates an example of a spiral sampling path for obtaining an initial set of k-space phase-encoding coordinates, in accordance with some embodiments of the technology described herein.
Figure 5A:
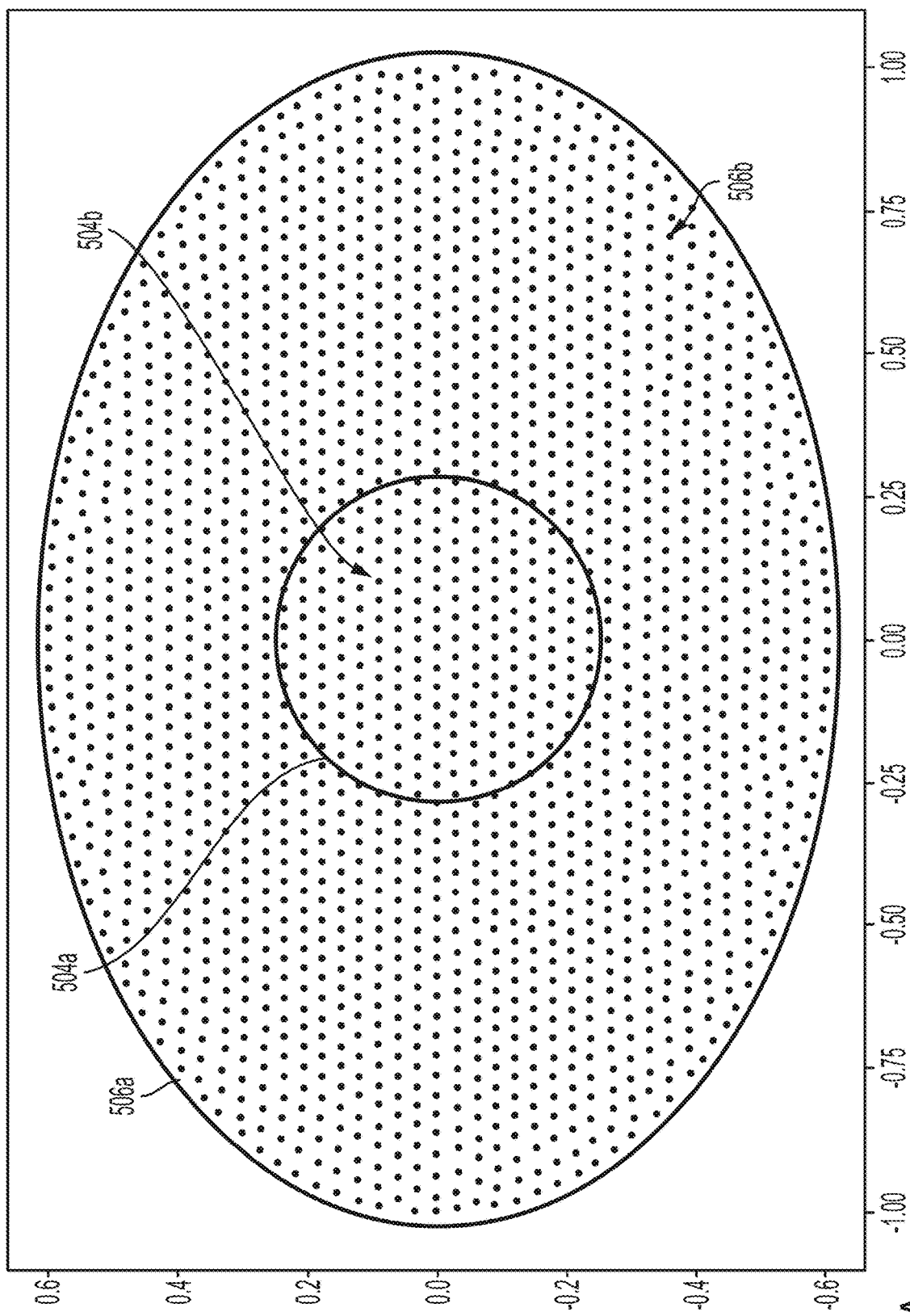
FIG. 5A illustrates an example of an initial set of phase-encoding coordinates, a central region of k-space, and an outer region of k-space complementary to the central region, in accordance with some embodiments of the technology described herein.

Process 300 begins at act 302, where an initial set of k-space phase encoding coordinates is obtained. The initial set of k-space phase encoding coordinates may comprise a set of two-dimensional coordinates in the phase-encoding plane. In some embodiments, the coordinates in the initial set may be distributed in a two-dimensional elliptical region of k-space (e.g., as shown in FIGS. 4A, 5A, and 6A), but other arrangements (e.g., rectangular) are possible, as aspects of the technology described herein are not limited in this respect. In these examples, the initial set of phase-encoding coordinates is elliptical because of the anisotropic spatial k-space resolution. This is not a limitation of the technology described herein. For example, in some embodiments, the initial set of phase-encoding coordinates may be circular covering a circular disk (rather than an elliptical disk) when the resolution is isotropic.

In some embodiments, the initial set of k-space phase encoding coordinates may be set according to an imaging field of view of the MRI system and a desired density of k-space phase-encoding coordinates. In some embodiments, the initial set of k-space phase encoding coordinates may be under-sampled, fully-sampled, or over-sampled relative to the Nyquist spatial frequency (an inverse of the imaging field of view) of the MRI system. In some embodiments, the initial set of k-space phase encoding coordinates may be distributed along a variable density or a Poisson disk distribution.

In some embodiments, the initial set of k-space phase encoding coordinates is generated as part of act 302. In some embodiments, the initial set of k-space phase encoding coordinates may have been generated prior to the start of process 300 and may be received (e.g., over a network) or accessed (e.g., from a memory) during act 302.

The discrete coordinates in FIGS. 4A, 5A, and 6A are illustrative examples of initial sets of k-space phase-encoding coordinates, in accordance with some embodiments of the technology described herein.

Next, process 300 proceeds to act 304, where a sampling path through at least some of the k-space coordinates in the initial set of k-space phase-encoding coordinates is generated. The generated path is generated in a way that mitigates the impact of eddy currents on the operation of an MRI system (e.g., a low-field MRI system) that operates using the sampling path.

For example, in some embodiments, the sampling path is generated such that neighboring k-space phase-encoding coordinates are kept "close" to one another by being within a threshold distance of one another. In some embodiments, the threshold distance may be set with respect to the Nyquist spatial frequency of the MRI system. For example, in some embodiments, generating the sampling path comprises generating the sampling path such that at least a threshold percentage (e.g., at least 80%, at least 85%, at least 90%, at least 95%, at least 99%, substantially all, all) k-space phase-encoding coordinates, which are neighboring along the generated sampling path, are within a threshold distance of one another, where the threshold distance depends on a Nyquist spatial frequency for the MRI system.

In some embodiments, the threshold distance may be less than or equal to C/FOV, where C is any real number in the range of $1 \leq C \leq 5$ (e.g., C=1, 1.5, 2, 2.5, 3, 3.5, 4, 4.5, 5, or any other suitable number between 1 and 5) and FOV represents a length of an imaging field of view of the low-field MRI system along a given direction. In some embodiments, the constant C may be any real number between 1 and 10 or between 1 and 20. In some embodiments, for example when the initial set of k-space phase encoding coordinates are oversampled related to the Nyquist spatial frequency, the constant C may be less than 1.

In some embodiments, a sampling path is generated according to process 305, which is described herein including below with reference to in FIG. 3B.

Next, process 300 proceeds to act 306, where an MRI system is operated to image a subject using a pulse sequence in accordance with the sampling path generated at act 304 to obtain spatial frequency data. The spatial frequency data may, in turn, be used to generate one or more images of the subject.

Figure 7:
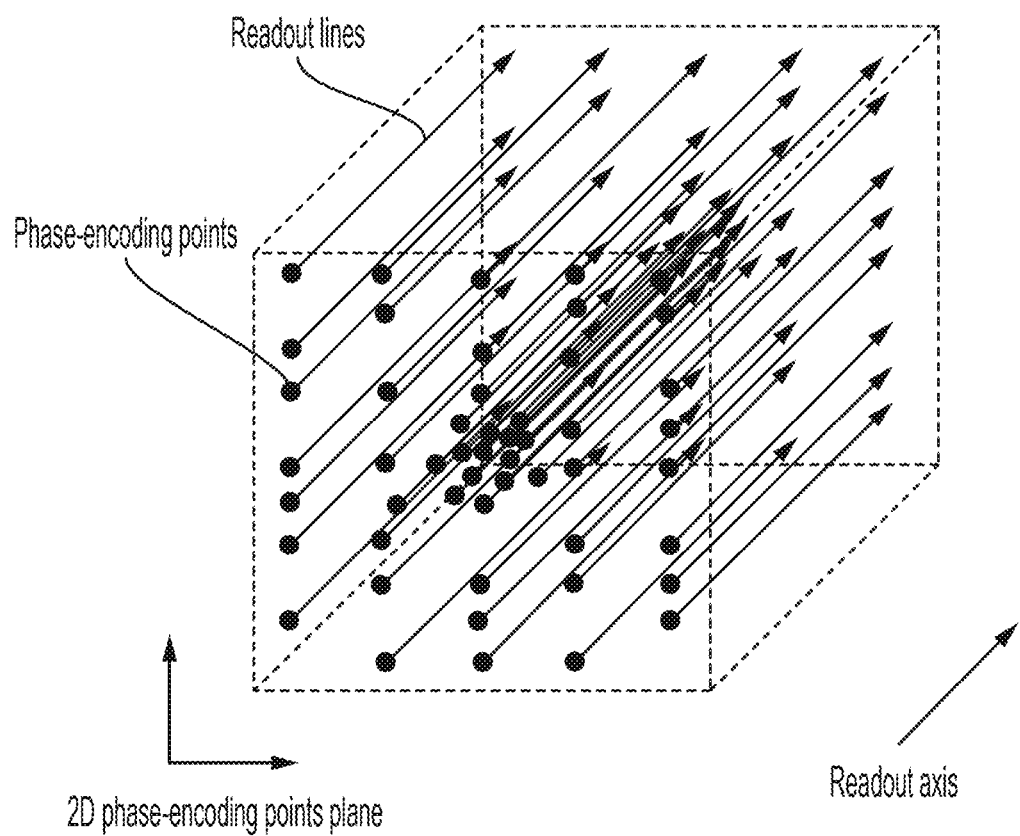
FIG. 7 illustrates a plurality of 2D phase encoding points in a plane and corresponding orthogonal readout lines from each phase encoding point, in accordance with some embodiments of the technology described herein.

In some embodiments, operating an MRI sequence using a pulse sequence in accordance with a sampling path comprises generating phase-encoding gradients in a sequence following the sequence of k-space phase-encoding coordinates along the sampling path. Additionally, the pulse sequence may employ readout lines orthogonal to the sampling path coordinates located in the phase-encoding plane. An example of such orthogonal readout lines is shown in FIG. 7.

In some embodiments, the pulse sequence may be a diffusion weighted imaging (DWI) pulse sequence. In some embodiments, operating an MRI system according to a DWI pulse sequence may include applying diffusion gradients before phase encoding gradients. Other aspects of a DWI pulse sequence may vary. For example, in some embodiments, the DWI pulse sequence may be a fast spin echo (FSE) DWI sequence. As another example, the DWI pulse sequence may be a steady-state free precession (SSFP) DWI sequence.

In some embodiments, the spatial frequency data collected at act 306 may be processed to detect and/or correct for motion of the subject being imaged. Additionally or alternatively, the spatial frequency data collected at act 306 may be processed to detect and/or correct for phase drift, phase errors, and/or any other imaging artefacts. For example, in some embodiments, where the sampling path is a self-navigating path (whereby a central region of k-space is repeatedly sampled by the sampling path), the spatial frequency data collected in the central region may be used (either alone or in combination with external patient position and/or motion sensors) to correct the spatial frequency data for motion artefacts.

Figure 8:
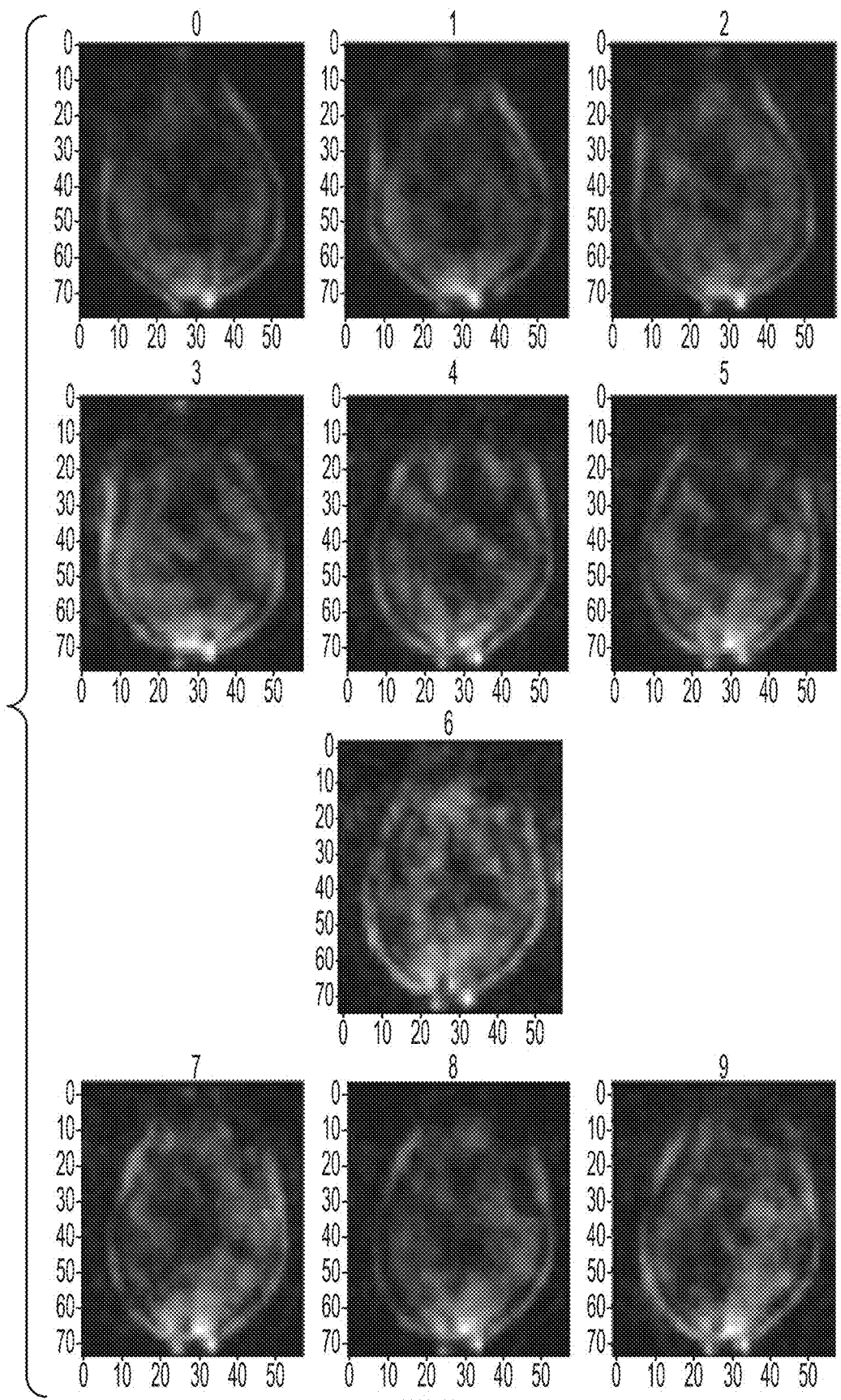
FIG. 8 illustrates an exemplary sequence of ten images reconstructed using a sampling path repeatedly sampling a central region of k-space, in accordance with some embodiments of the technology described herein.

In some embodiments, motion of the patient may be detected by reconstructing a series of images (or sub-images) from a series of sets (or subsets) of spatial frequency data obtained during a series of visits to the central region of k-space. Motion of the patient may then be detected by comparing the content of the images. For example, a set of 10 reconstructed images is shown in FIG. 8. These images are low-resolution images because they are constructed from spatial frequency data in the central region of k-space. In this example, motion of the subject can be detected by comparing the third and fourth images.

Additionally or alternatively, motion of the patient may be detected by using one or more external sensors. The external sensor(s) may be of any suitable type. For example, the external sensor(s) may comprise one or more optical sensors (e.g., one or more cameras), one or more RF sensors, one or more accelerometers and/or gyroscopes, one or more dipole antennas, and/or any other suitable type of motion sensor.

Once motion is detected, there are a number of ways to correct the spatial frequency data for its presence. For example, in some embodiments, at least some of the spatial frequency data may be discarded and not used for reconstruction. For instance, in the illustrative example of FIG. 8, spatial frequency data used to generate the first three images (prior to patient motion) may be discarded and only the spatial frequency data used to generate the last seven images (after patient motion) may be employed.

As another example, in some embodiments, images preceding a subject's motion may be registered to (e.g., aligned with) images following the subject's motion. Once registered, the images (or, alternatively, the spatial frequency data used to generate the images) may be combined. For example, in some embodiments, the spatial frequency data collected prior to motion of a patient and spatial frequency data collected after motion of the patient may be used to estimate transformation representing the patient's movement (e.g., as described herein including with reference to the Section titled "Retrospective Motion Correction"). In turn, the transformation (which may be a rigid transformation including a rotation and/or a translation) may be used to register pre- and post-motion images and/or spatial frequency data. This may be done for example by applying a phase shift corresponding to the translation (according to the Fourier shift theorem) and a rotation of the k-space coordinates corresponding to the rotation (according to the Fourier rotation theorem).

Figure 9D:
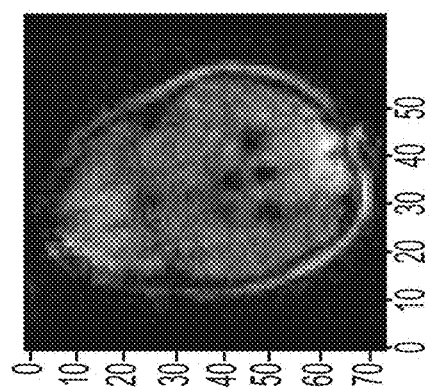
FIGS. 9A-9D illustrate retrospective motion correction in accordance with some embodiments of the technology described herein.
Figure 9C:
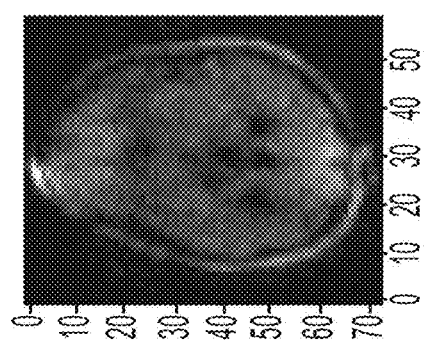
Figure 9B:
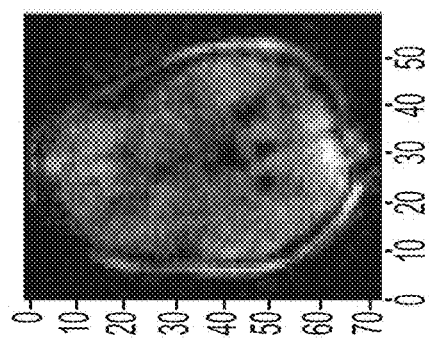
Figure 9A:
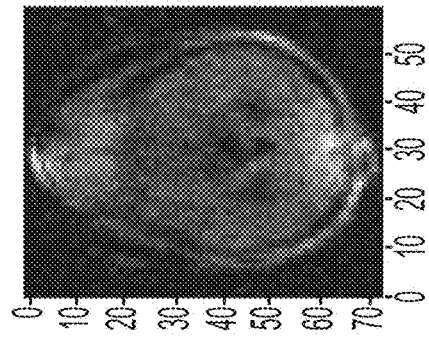

An example of this approach is shown in FIGS. 9A-9D. FIG. 9A illustrates an example of motion-corrupted image reconstructed from raw data; no correction is performed. FIG. 9B illustrates the image reconstructed from a first set of spatial frequency data collected before the motion occurred, while FIG. 9C illustrates the image reconstructed from a second set of spatial frequency data collected after the motion occurred. FIG. 9D illustrates the image formed by merging the images shown in FIGS. 9B and 9C after alignment.

In some embodiments, any number of sub-images such as those illustrated in FIGS. 9B and 9C may be reconstructed separately, then registered before being merged. In some embodiments, the motion corrected sub-images may be merged directly or their corresponding motion corrected spatial frequencies may be merged before being reconstructed into a single image, as aspects of the technology described in the embodiments are not limited in this respect. Further aspects of motion correction are described herein including below in Sections titled "Retrospective Motion Correction" and "Prospective Motion Correction".

Figure 3B:
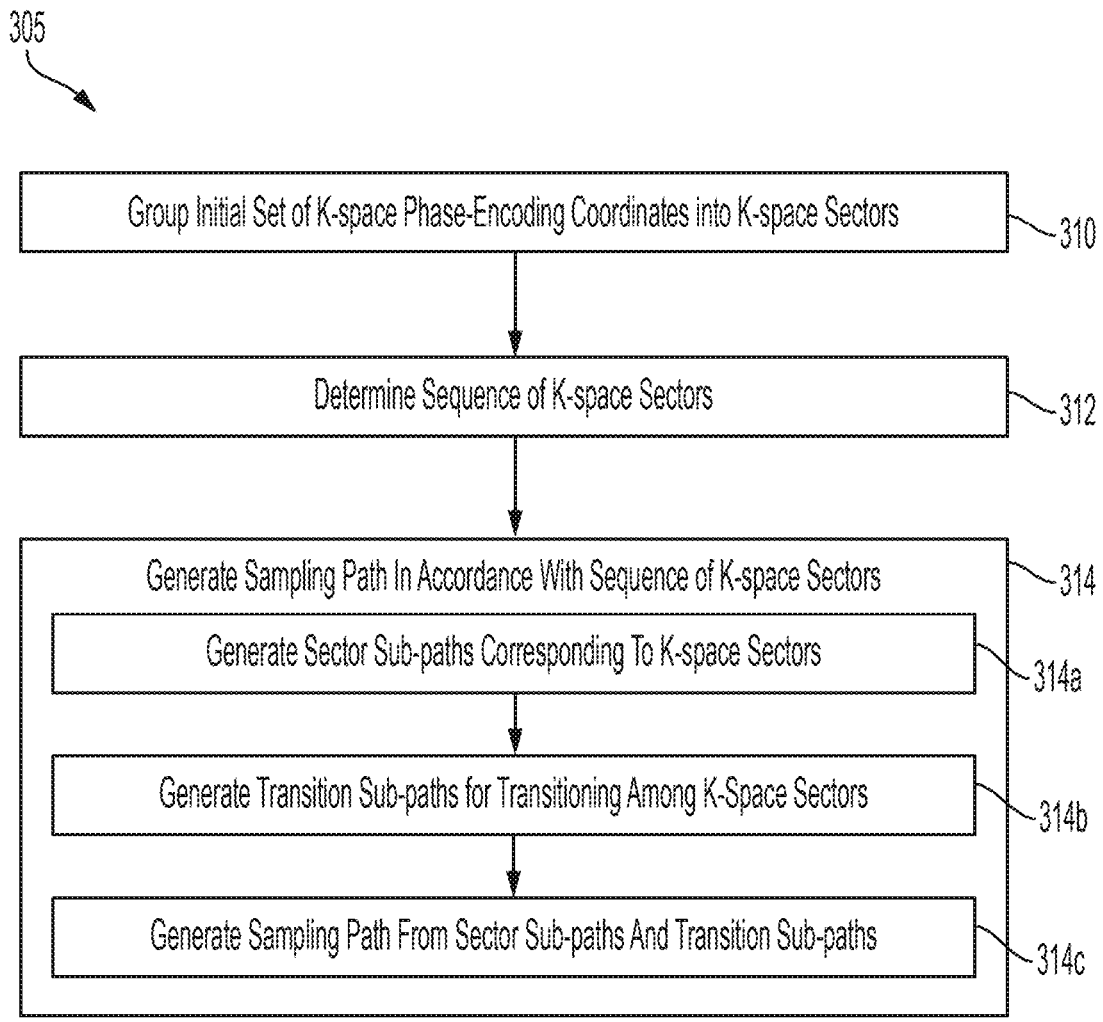
FIG. 3B is a flowchart of an illustrative process 305 for generating a sampling path that mitigates the impact of eddy currents on operation of the MRI system, in accordance with some embodiments of the technology described herein.

As described above, in some embodiments, the sampling path generated at act 304 of process 300 may be generated using process 305 shown in FIG. 3B. Process 305 is an illustrative process for generating a sampling path that mitigates the impact of eddy currents on operation of the MRI system, in accordance with some embodiments of the technology described herein. Process 305 may be performed using any suitable computing device(s), as aspects of the technology described herein are not limited in this respect.

Process 305 begins at act 310, where an initial set of k-space phase-encoding coordinates (e.g., the initial set of coordinates obtained at act 302) are grouped into k-space sectors. Each k-space sector may include one or more coordinates from the initial set of k-space phase-encoding coordinates. In some embodiments, the k-space sectors may be disjoint. In some embodiments, at least two of the k-space sectors may share one or more coordinates. In some embodiments, at least one of the k-space sectors should include coordinates in a central region of k-space, which contains low spatial frequency content.

Figure 4B:
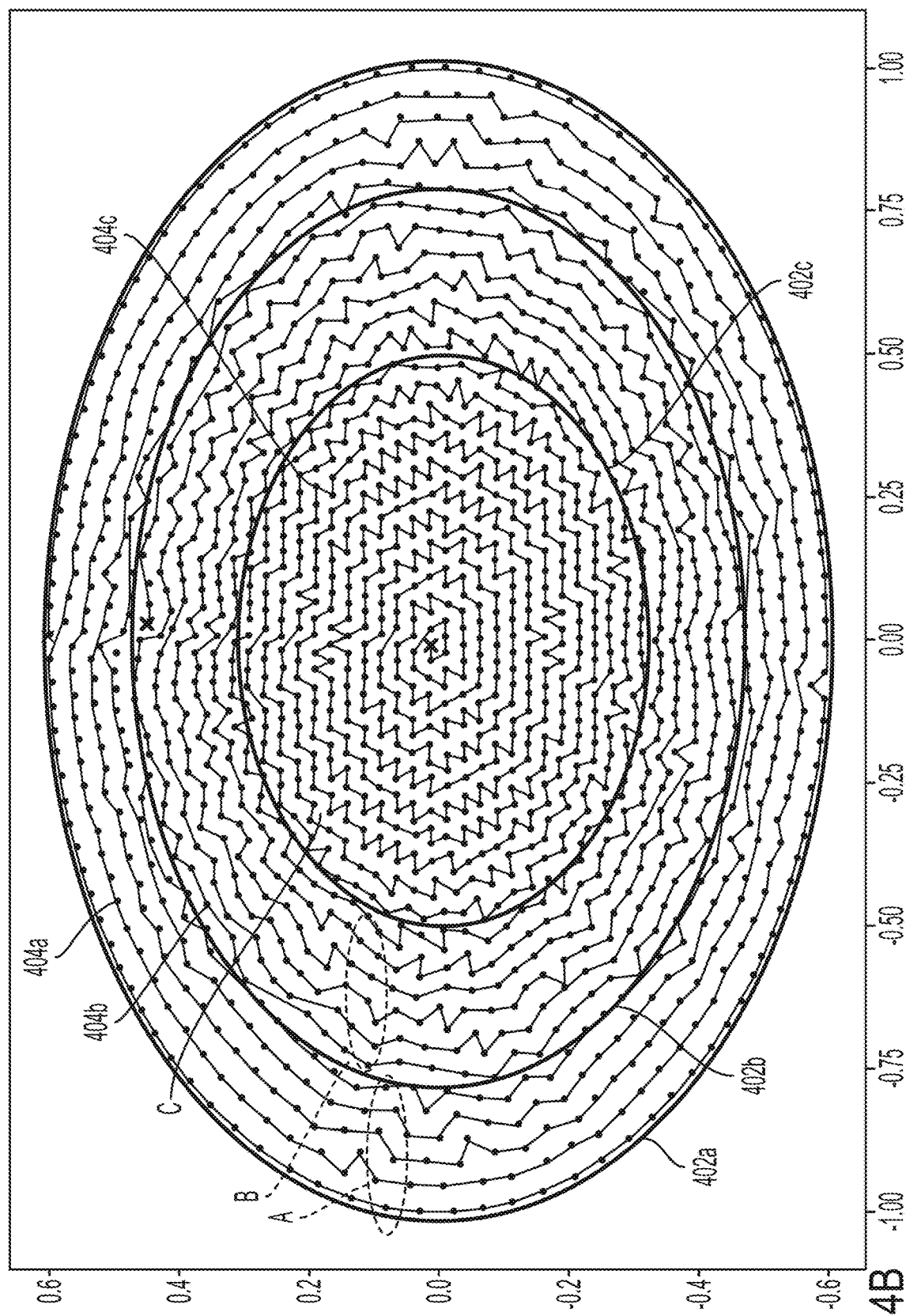
FIG. 4B illustrates sectors of k-space phase-encoding coordinates, obtained by grouping k-space phase-encoding coordinates shown in FIG. 4A, and sampling sub-paths through the sectors, in accordance with some embodiments of the technology described herein.

In some embodiments, the k-space sectors may be concentric relative to one another. For example, FIG. 4B shows multiple concentric elliptical sectors: A, B, and C. The sector C is located within a central region of k-space, which in this example is demarcated by elliptical boundary 402c. The sector B is located in a second region of k-space surrounding the central region of k-space. In this example, the second region is demarcated by the elliptical boundaries 402b and 402c. The sector C is located in a third region of k-space surrounding the second region. In this example, the third region is demarcated by the elliptical boundaries 402a and 402b. As another example, FIGS. 5A and 6A show concentric regions, with the central region (e.g., region 504b within circular boundary 504a in FIG. 5A, the region within circular boundary 602a in FIG. 6A) being circular and the peripheral region being elliptical (e.g., region 506b within elliptical boundary 506a in FIG. 5A, the region within elliptical boundary 602b in FIG. 6A). In other embodiments, the concentric k-space sectors may be rectangular, and/or square, as aspects of the technology described are not limited in this respect.

The central region of k-space may have any suitable shape. For example, as shown in FIG. 4B the central region may include a two-dimensional elliptical region (disk) that includes an origin of k-space. As another example, the central region may include a circular region (see e.g., the circular region within circular boundary 602a shown in FIG. 6A). In other embodiments, the central region may include a two-dimensional (2D) rectangular and/or square region that includes an origin of k-space. In some embodiments, the central region of k-space is a region located entirely within a threshold distance of the origin of k-space. Generally, the central region of k-space contains low spatial frequency information (e.g., shape outlines, brightness, image contrast, etc.), where is the region outside the central region contains high spatial frequency information (e.g., information about edges, details, corners, etc.).

Figure 5B:
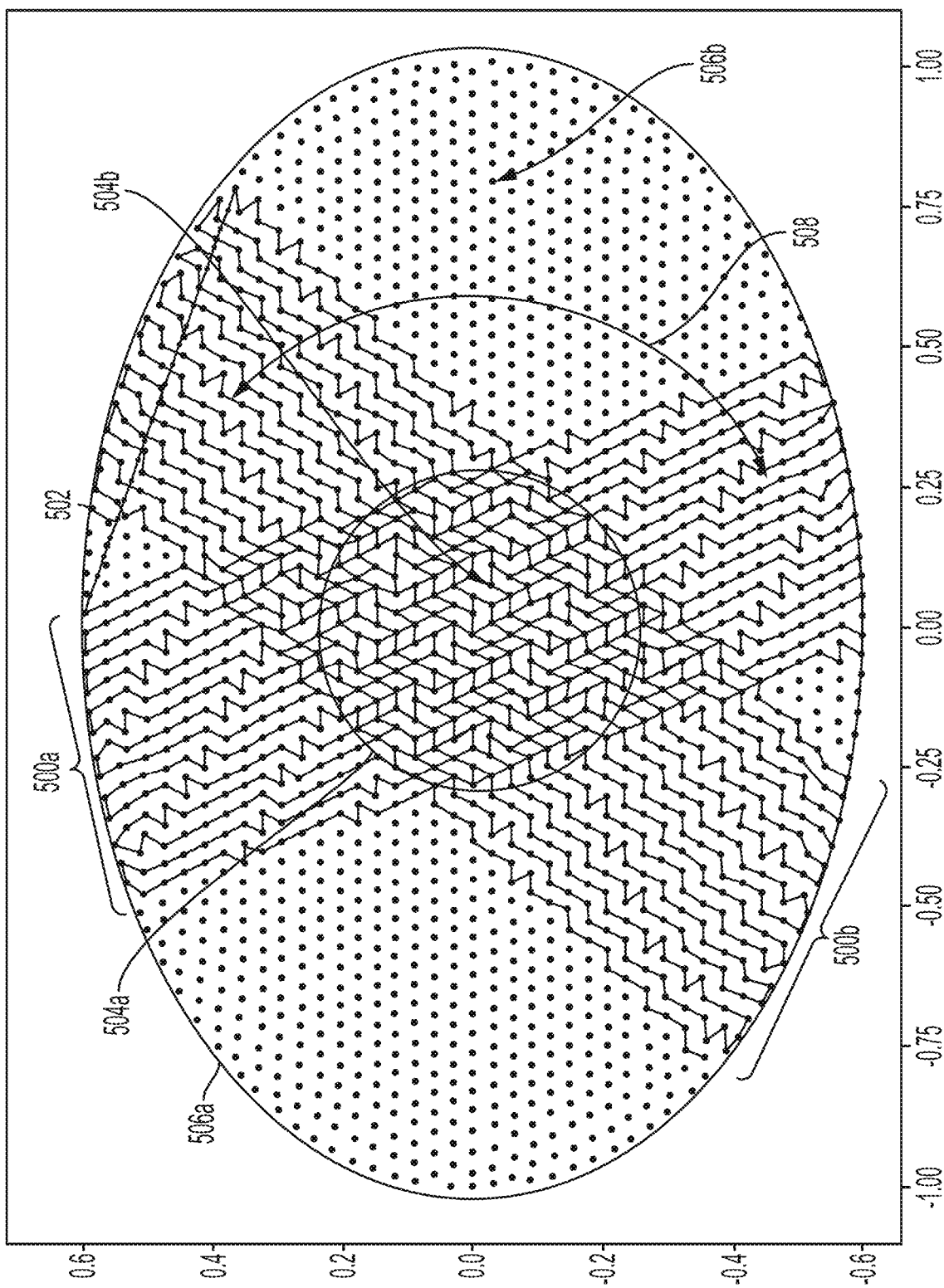
FIG. 5B illustrates a sampling path which samples the central and outer regions of k-space, wherein the sampling path comprises sub-paths zig zagging within radial-band sectors and a transition sub-path between the radial-band sectors, in accordance with some embodiments of the technology described herein.
Figure 5C:
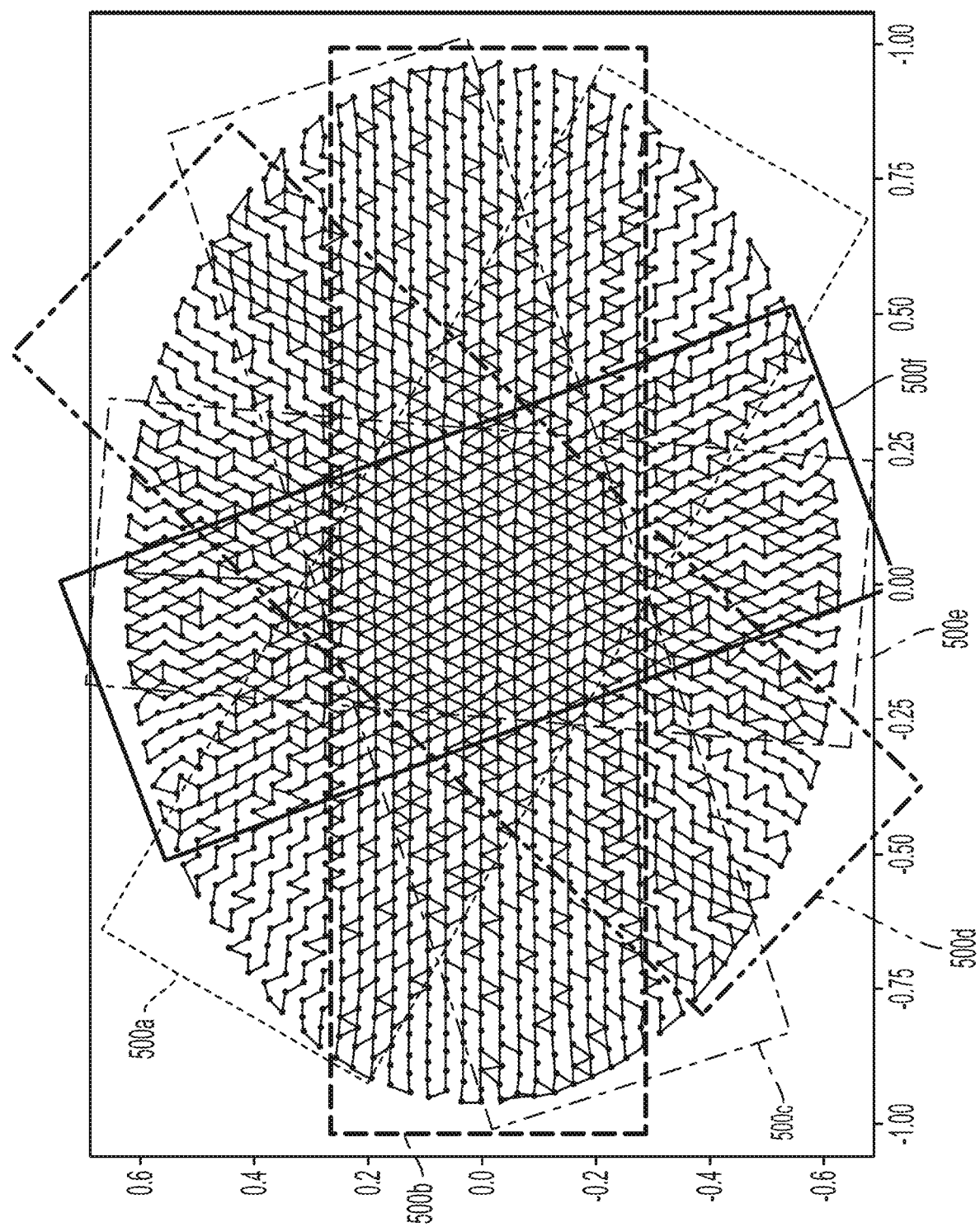
FIG. 5C illustrates sector sub-paths zig zagging with six radial-band sectors, in accordance with some embodiments of the technology described herein.

In some embodiments, the k-space sectors may be radial. For example, in some embodiments, the initial set of k-space phase-encoding coordinates may be grouped into radial band sectors. For example, FIG. 5B shows two radial band sectors 500a and 500b. As another example, FIG. 5C shows six radial band sectors, 500a-500f. As can be seen in FIG. 5B, each of the radial band sectors samples (e.g., includes points in) two k-space regions: (1) a central region 504b of k-space, which is the region within boundary 504a; and (2) a peripheral region 506b of k-space, which surrounds the central region 504b and, in this example, is located between boundaries 504a and 506a.

Figure 6B:
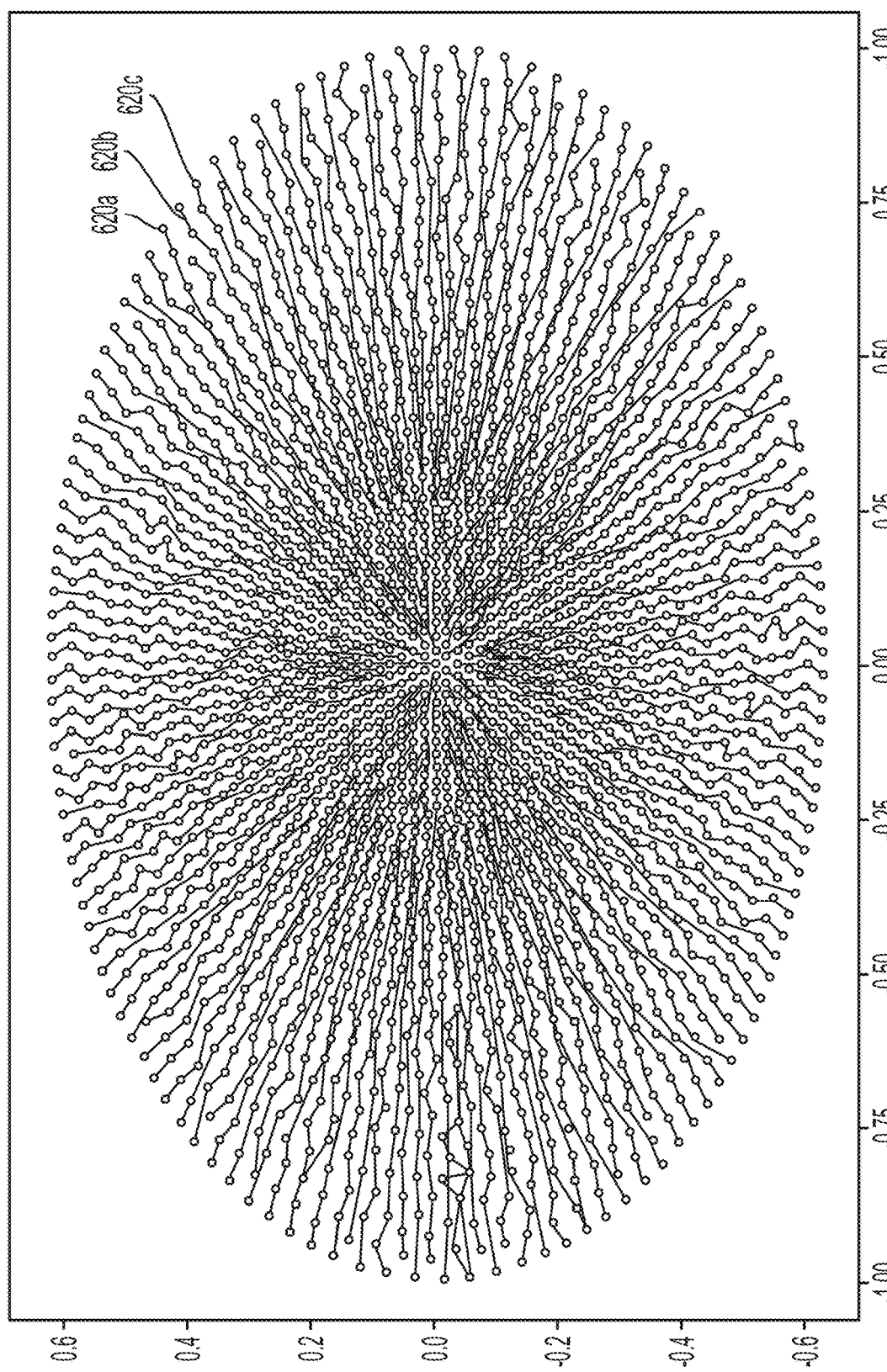
FIG. 6B illustrates radial sectors traversing the central and outer regions of k-space, in accordance with some embodiments of the technology described herein.

As another example, in some embodiments, the k-space sectors may be grouped in radial spoke sectors. A radial spoke sector may include k-space coordinates along a radial line extended from a central region of k-space to a peripheral region of k-space surrounding the central region. FIG. 6B shows an example of radial spoke sectors, 620a, 620b, 620c among other unlabeled radial spoke sectors.

After the initial set of k-space phase-encoding coordinates is grouped into k-space sectors at act 310, process 305 proceeds to act 312, where a sequence of k-space sectors is determined. In some embodiments, determining the sequence of k-space sectors comprises determining a sequence that repeatedly samples the central region of k-space multiple times. As described herein, repeatedly sampling the central region of k-space facilitates detection and/or correcting for a subject's motion.

For example, in some embodiments, the sequence of sectors may sample the central region of k-space more frequently than other regions of k-space. As one non-limiting example, with reference to FIG. 4B, at least a portion of the sequence of sectors determined at act 312 may be the sequence: A-B-C-B-C-A-C-B-C, in which the central region is sampled (by using sector C) twice as frequently than each of the other two sectors. As another example, the sequence of sectors may include a sequence of radial band sectors (e.g., the radial band sectors shown in FIGS. 5B and 5C) or radial spoke sectors (e.g., the radial spoke sectors shown in FIG. 6B), and since each of these sectors samples the central region, a sequence of such sectors samples the central region repeatedly.

In some embodiments, determining the sequence of k-space sectors comprises determining a sequence that results in substantially uniform coverage of k-space and high-temporal incoherence between successive sectors. For example, in embodiments where the sectors are radial (e.g., radial bands or spokes), the sequence of sectors may be chosen in accordance with a golden angle ordering scheme, whereby the angle between pairs of consecutive sectors in the sequence is approximately the golden angle (e.g., approximately or exactly 111.25 degrees). For example, as shown in FIG. 5B, one radial band sector (e.g., sector 500a) is rotated by approximately the golden angle (e.g., angle 508) relative to another radial band sector (e.g., sector 500b), and the sequence of sectors may include the sectors 500a and 500b consecutively. As another example, the six radial band sectors 500a-f in FIG. 5C, may be chosen in a sequence to form the sequence of sectors such that successive sectors in the sequence are at approximately the golden angle (111.25 degrees). As yet another example, the radial spoke sectors in FIG. 6B may be chosen in a sequence to form the sequence of sectors such that successive radial spoke sectors are at approximately the golden angle. In other embodiments, an angle other than the golden angle (or an approximation thereof) may be used, as aspects of the technology described herein are not limited in this respect.

After the sequence of k-space sectors is determined at act 312, process 305 proceeds to act 314, where a sampling path is generated in accordance with a sequence of k-space sectors. For example, in some embodiments, the sampling path is generated by: (1) generating sector sub-paths corresponding to k-space sectors at act 314a; (2) generating transition sub-paths for transition among k-space sectors at act 314b; and (3) generating a sampling path from sector sub-paths and transition sub-paths at act 314c.

In some embodiments, at act 314a, a respective sub-path through k-space coordinates is generated for each of the sectors. A sub-path for a k-space sector may include a sequence of k-space coordinates of at least some (e.g., all) k-space coordinates in the sector. Additionally, a sub-path for a k-space sector may include one or more other k-space coordinates. For example, a sub-path for a central k-space sector in a central region of k-space may include at least some (e.g., all) k-space coordinates from the central k-space sector and one or more other k-space coordinates in the central region even of the other coordinate(s) were not in the initial set of coordinates and, therefore, were not part of the central k-space sector as determined at act 310.

In some embodiments, generating a sub-path for a sector comprises generating a sequence of k-space coordinates such that at least a threshold percentage (e.g., at least 80%, at least 85%, at least 90%, at least 95%, at least 99%, substantially all, all) k-space phase-encoding coordinates, which are neighboring along the generated sampling path, are within a threshold distance of one another, where the threshold distance depends on a Nyquist spatial frequency. As described herein, this helps mitigate the effect of eddy currents on operation of an MRI system using a pulse sequence in accordance with the sampling path.

In some embodiments, the threshold distance may be less than or equal to C/FOV, where C is any real number in the range of 1≤C≤5 (e.g., C=1, 1.5, 2, 2.5, 3, 3.5, 4, 4.5, 5, or any other suitable number between 1 and 5). In some embodiments, the constant C may be any real number between 1 and 10 or between 1 and 20. In some embodiments, for example when the initial set of k-space phase encoding coordinates are oversampled related to the Nyquist spatial frequency, the constant C may be less than 1.

A sub-path for a k-space sector may have any suitable shape. FIGS. 4B, 5B, and 6B illustrate examples of sector sub-paths, according to some embodiments of the technology described herein. FIG. 4B illustrates spiral sector sub-paths 404a, 404b, and 404c generated for sectors A, B, and C. FIG. 5B illustrates zig-zag sub paths through radial band sectors. FIG. 6B shows radial sub-paths along with the radial spokes. It should be appreciated that these examples are illustrative and that other embodiments may employ any suitable sub-path in which at least a threshold of percent of neighboring k-space phase-encoding coordinates are within a threshold distance of one another.

In some embodiments, at act 314b, transition sub-paths for transitioning among k-space sectors are generated. Like the sub-sector sub-paths, transition sub-paths are generated to be smooth so that at least a threshold percentage of neighboring phase-encoding k-space coordinates are within a threshold distance of one another. This helps mitigate the effect of eddy currents on operation of an MRI system using a pulse sequence in accordance with the sampling path.

A transition sub-path for transitioning between k-space sectors may include k-space coordinates in the k-space sectors. Additionally, a transition sub-path for transitioning between k-space sectors may include one or more other k-space coordinates. For example, a transition sub-path may include one or more k-space coordinates not part of the initial set of k-space phase encoding coordinates. Such coordinates may be added when generating a sampling path so that neighboring coordinates along the sampling path are within a threshold distance, which may help mitigate the effect of eddy currents on operation of an MRI system using a pulse sequence in accordance with the sampling path.

Figure 4C:
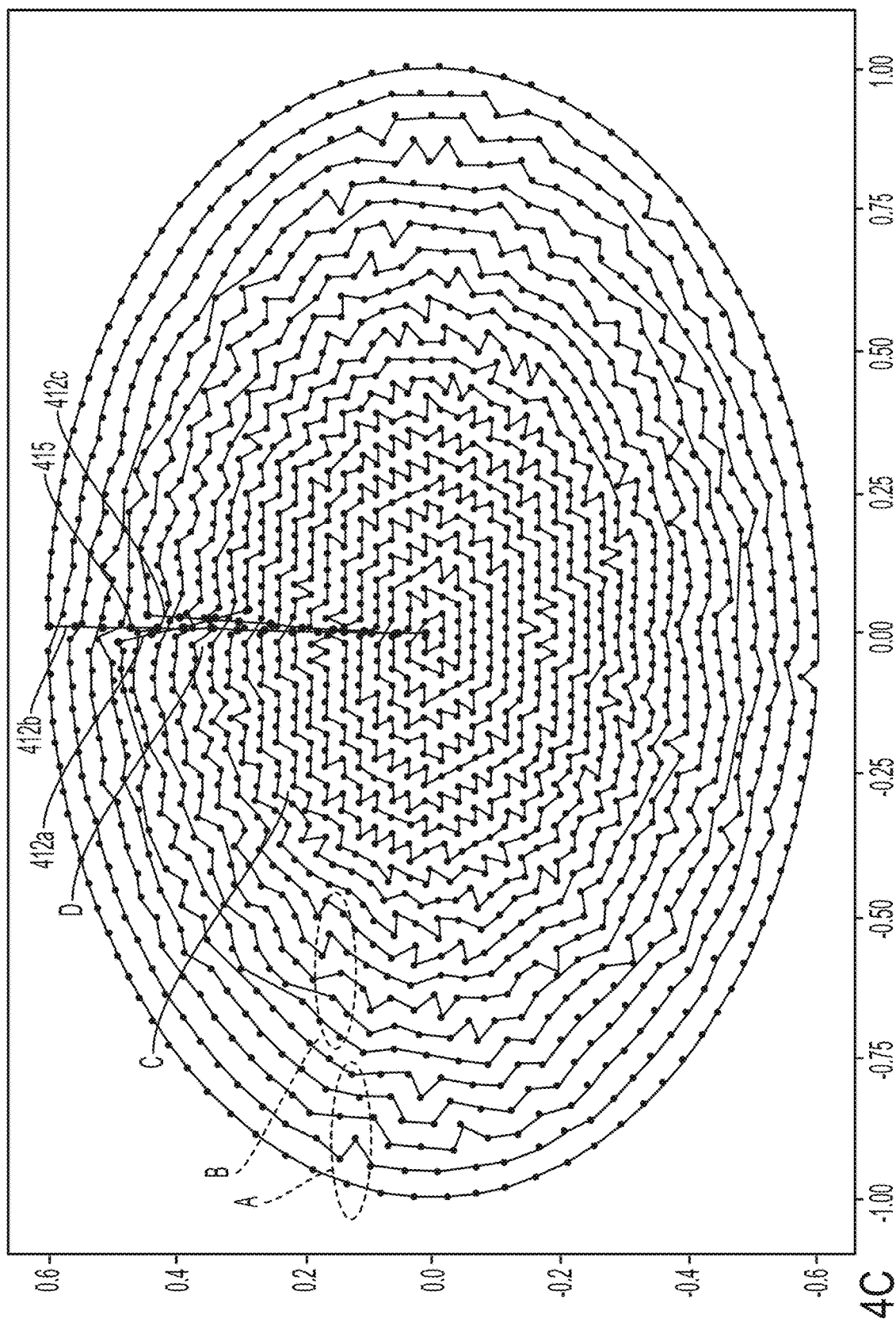
FIG. 4C illustrates transition sub-paths between the sectors shown in FIG. 4B, in accordance with some embodiments of the technology described herein.

One example of transition sub-paths is shown in FIG. 4C, which shows sub-paths D. In this example, the sub-paths D include three different sub-paths: (1) transition sub-path 412a for transitioning between sectors A and C; (2) transition sub-path 412b for transitioning between sectors A and the center of sector C; and (3) transition sub-path 412c for transitioning between sectors B and C. In this example, the transition sub-paths 412a-c include coordinates part of the initial set of k-space phase-encoding coordinates and coordinates not part of the initial set (e.g., coordinate 415). For example, for a given sequence of sector sub-paths, the transition sub-paths connect sectors sub-paths according to the following sequence: A-B-C-D-B-C-D-A-D-C-B-C. It should be appreciated that three transition sub-paths are shown in this example for clarity, and the transition paths D may include more than three transition sub-paths, as aspects of the technology described herein are not limited by the number of transition sub-paths between sectors. Another example of a transition sub-path is shown in FIG. 5B, which shows an example of a transition sub-path 502 connecting the sub-paths of sectors 500a and 500b.

In some embodiments, at act 314c, a sampling path is generated from sector sub-paths and transition sub-paths. In some embodiments, the sampling path is generated by linking the sector sub-paths according to the sequence determined at act 312, with transition sub-paths to generate a sampling path.

In some embodiments, the sampling path formed from the sector and transition sub-paths may comprise multiple non-contiguous portions containing coordinates in a central region of k-space. In this way, the sampling path may repeatedly sample the central region.

Retrospective Motion Correction Using a Reconstruction with Phase Correction

The inventors have appreciated that a subject may move or shift during MR imaging, and that the subject's motion introduces artefacts into resulting MR images reducing their quality and medical utility. Accordingly, the inventors have developed a technique for generating MR images from spatial frequency data obtained by an MRI device in circumstances when the subject moved during imaging. Unlike some conventional techniques for retrospective motion correction, the technique developed by the inventors takes into account phase information when correcting the spatial frequency data for the effect of motion. This provides a substantial improvement to resulting motion-corrected MR images and gets rid of undesirable banding artefacts and other artefacts, as described herein.

In some embodiments, the technique developed by the inventors involves dividing the spatial frequency data into two sets of spatial frequency data, corresponding to two positions of the subject during imaging, with spatial frequency data collected during the subject's movement between the positions being discarded. In turn, the sets of spatial frequency data are used to estimate a transformation (e.g., a rigid transformation comprising a rotation and a translation) representing the subject's motion, and the transformation may be used to correct the spatial frequency data for the effect of motion. It should be appreciated that the spatial frequency data may be divided into any suitable number of sets of spatial frequency data corresponding to any suitable number of positions of the subject during MR imaging (e.g., 3, 4, 5, 6, etc.), and pairwise rigid transformations may be estimated therebetween for correcting spatial frequency data for the subject's motion, as aspects of the technology described herein are not limited in this respect. In some such embodiments, the registration may be performed with respect to the first image, which may be considered as the "reference" image of the patient in a "reference" position. For clarity of presentation, however, the technique is described with respect to the case where the subject moves once from a first position to a second position.

Briefly, we set notation to simplify subsequent description of some embodiments. In particular, let the spatial frequency data collected during imaging of the subject be denoted by $(k_0, b_0)$, where $k_0$ represents k-space sample coordinates and $b_0$ represents k-space data values. Since the spatial frequency data $(k_0, b_0)$ are obtained during the subject's motion from a first position to a second position, an image $x_0$ generated from these data is motion corrupted. Moreover, let the first spatial frequency data $(k_1, b_1)$, where $k_1$ represents k-space sample coordinates and $b_1$ represents k-space data values, denote the spatial frequency data collected when the patient is in the first position, and let the second spatial frequency data $(k_2, b_2)$, where $k_2$ represents k-space sample coordinates and $b_2$ represents k-space data values, denote the spatial frequency data collected when the patient is in the second position, with any spatial frequency data obtained during the motion from the first to the second position being discarded such that the sum of the number of samples in the first spatial frequency data $(m_1)$ and the second spatial frequency data $(m_2)$ is smaller than the total number of samples $(m_0)$ in the spatial frequency data $(k_0, b_0)$ (i.e., $m_1+m_2 \le m_0$).

In some embodiments, one possible approach for correcting the spatial frequency data (e.g., $(k_0, b_0)$) for the subject's motion may involve: (1) generating a first image $x_1$ from the first spatial frequency data $(k_1, b_1)$; (2) generating a second image $x_2$ from the second spatial frequency data $(k_2, b_2)$; (3) estimating a transformation T (e.g., a rigid transformation comprising a rotation and/or a translation) from the first and second images; and (4) generating a corrected image using the first image, the second image, and the transformation between them. FIGS. 11A-11D show illustrative images $x_0$, $x_1$, $x_2$, and $x^r_2$, respectively, acquired with an SSFP sequence.

For example, in some embodiments, the corrected image may be generated as a sum of the magnitude of the first image (e.g., $|x_1|$) and a magnitude of the corrected second image (e.g., $|x^r_2|=|Tx_2|$) according to:

$$x^c_{magnitude}=|x_1|+|x^r_2|.$$

Figure 11A:
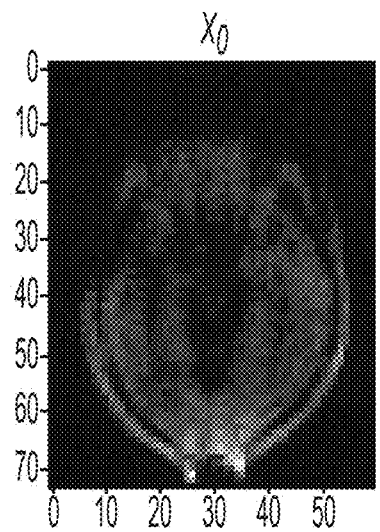
FIGS. 11A-K illustrate examples of applying retrospective motion correction techniques, in accordance with some embodiments of the technology described herein.
Figure 11B:
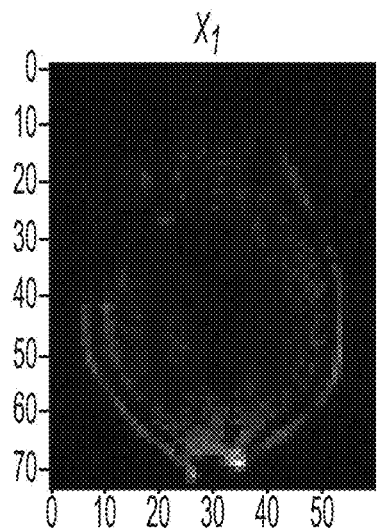
Figure 11C:
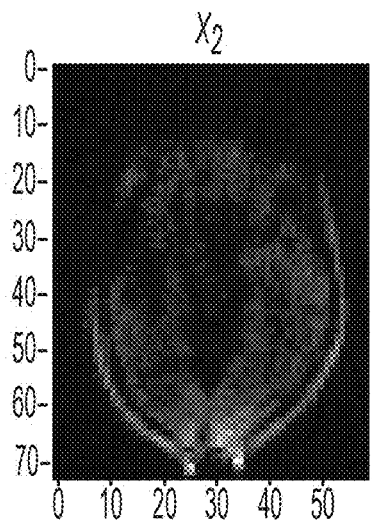
Figure 11D:
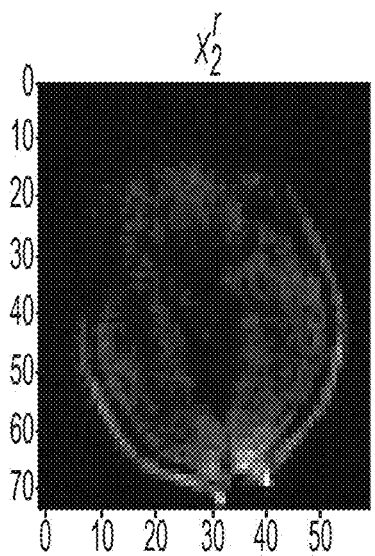
Figure 11E:
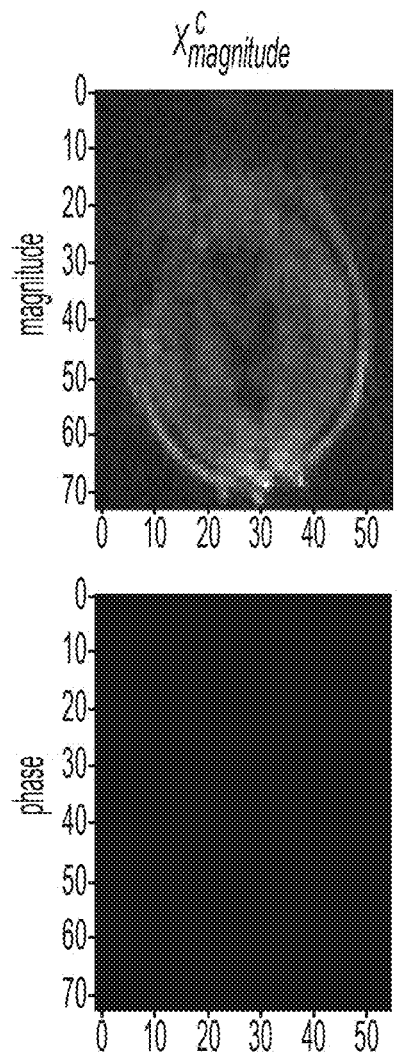

FIG. 11E shows the result $x^c_{magnitude}$ of the reconstruction using magnitude summation according to the above equation. However, this approach discards phase information from the two images being combined, leading to an overall lower SNR.

As an alternative, and to increase the signal-to-noise ratio of the resulting MR image (which is important generally, but especially so in a low-field MRI setting), in some embodiments, the images could be combined directly in the complex domain according to:

$$x^c_{complex}=|x_1+x^r_2|.$$

Figure 11F:
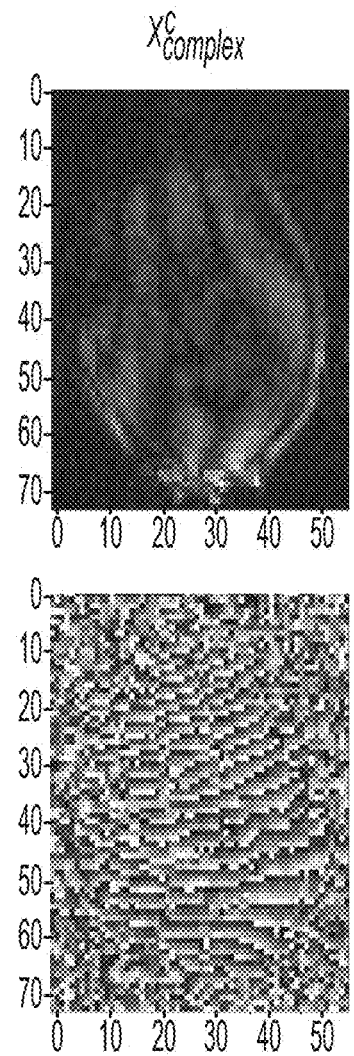

FIG. 11F shows the result $x^c_{complex}$. However, as can be seen in FIG. 11F, this approach results in banding artifacts due to the residual spatial phase $\phi_0$ (reflecting imperfections such as field inhomogeneities, sequence delays, etc.), which is a function of space and is independent of the image. When $x_2$ was transformed by T, so was its residual spatial phase $\phi_0^r = T\phi_0$, which is now interfering with $x_1$'s residual phase $\phi_0$.

Figure 11G:
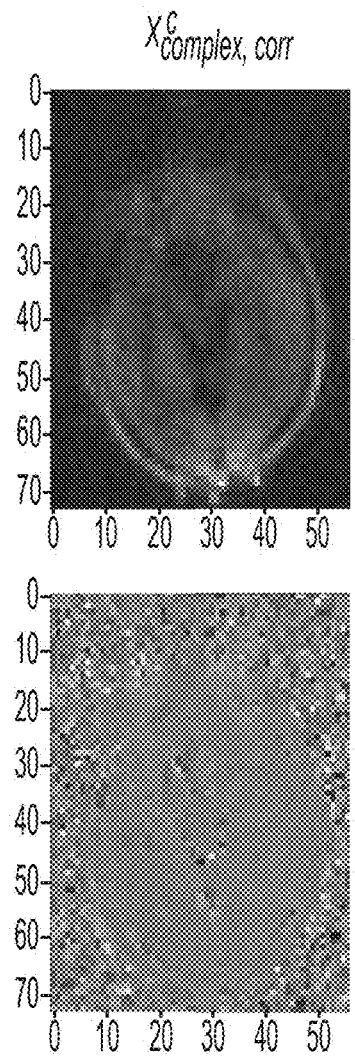
Figure 11H:
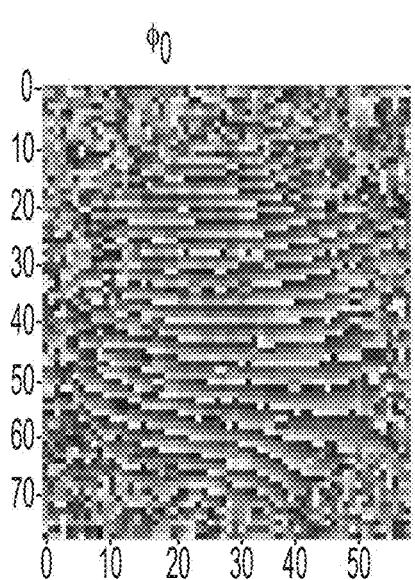
Figure 11I:
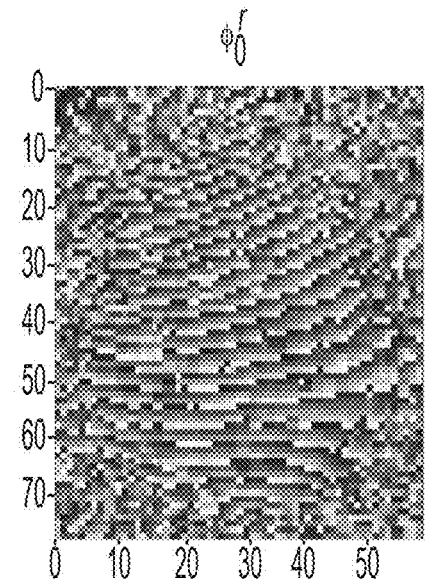

Accordingly, the inventors have recognized that an improved MR image may be obtained by correcting for residual spatial phase prior to combining the images. In some embodiments, this may be performed according to:

$$x_{complex,\ corr}^c = |x_1 \odot e^{-i\phi_0} + x_2 \odot e^{-i\phi_0^r}|,$$

with the residual phase $\phi_0$ being estimated using the phase of the initial motion corrupted image $x_0$ according to $\phi_0 \approx \angle x_0$, for example. FIG. 11G shows the result of this approach—the banding artefacts present in FIG. 11F are substantially reduced. FIGS. 11G-I respectively show the residual spatial phase $\phi_0$ and the corrected residual phase $\phi_0^r$ (after rigid transformation) for this example.

Alternatively, the inventors have developed a technique for taking residual spatial phase into account in the spatial frequency domain (k-space). This approach may be advantageous because, in some circumstances, there may not be enough samples for each position of the subject to reconstruct the images $x_1$ and $x_2$ with sufficiently high-quality and because correcting in k-space avoid the inaccuracies resulting from interpolating a gridded image obtained using a Cartesian reconstruction. Aspects of this technique are described herein, including with reference to FIG. 10. FIGS. 11J and 11K show results of such a correction and reconstruction.

Accordingly, some embodiments are directed to a method for compensating magnetic resonance imaging (MRI) data for artefacts caused by motion of a subject being imaged, the method comprising using at least one computer hardware processor to perform: (1) obtaining spatial frequency data obtained by using a magnetic resonance imaging (MRI) system to perform MRI on a patient, the spatial frequency data including first spatial frequency data and second spatial frequency data; (2) determining a transformation (e.g., a rigid transformation comprising a rotation and/or a translation) using a first image obtained using the first spatial frequency data and a second image obtained using the second spatial frequency data; (3) determining a residual spatial phase using the initial image $x_0$; (4) correcting, using the transformation, second spatial frequency data and the residual spatial phase, to obtain corrected second spatial frequency data and a corrected residual spatial phase; and (5) generating a magnetic resonance (MR) image using the corrected second spatial frequency data and the corrected residual spatial phase.

In some embodiments, generating the MR image is performed by: (1) generating a corrected second image using the corrected second spatial frequency data and the corrected residual spatial phase; and (2) generating the MR image by combining the first image and the corrected second image.

In some embodiments, generating the MR image comprises generating the MR image by using the first spatial frequency data, the corrected spatial frequency data, and the corrected residual phase. This may be done in any suitable way. For example, reconstruction may be performed using an iterative linear reconstruction technique, a conjugate gradient SENSE reconstruction technique, a non-linear iterative reconstruction technique, a deep-learning reconstruction technique (e.g., any of the techniques described in U.S. Pat. Pub. No.: 2020/0033431, titled "Deep Learning Techniques For Magnetic Resonance Image Reconstruction", filed on Jul. 29, 2019, which is incorporated by reference herein in its entirety), a technique employing a non-uniform fast Fourier transform, a parallel imaging reconstruction technique, an l1-regularized reconstruction technique, a model-based reconstruction technique, a technique employing gridding followed by a discrete Fourier transform, and/or any other suitable reconstruction technique.

Figure 10:
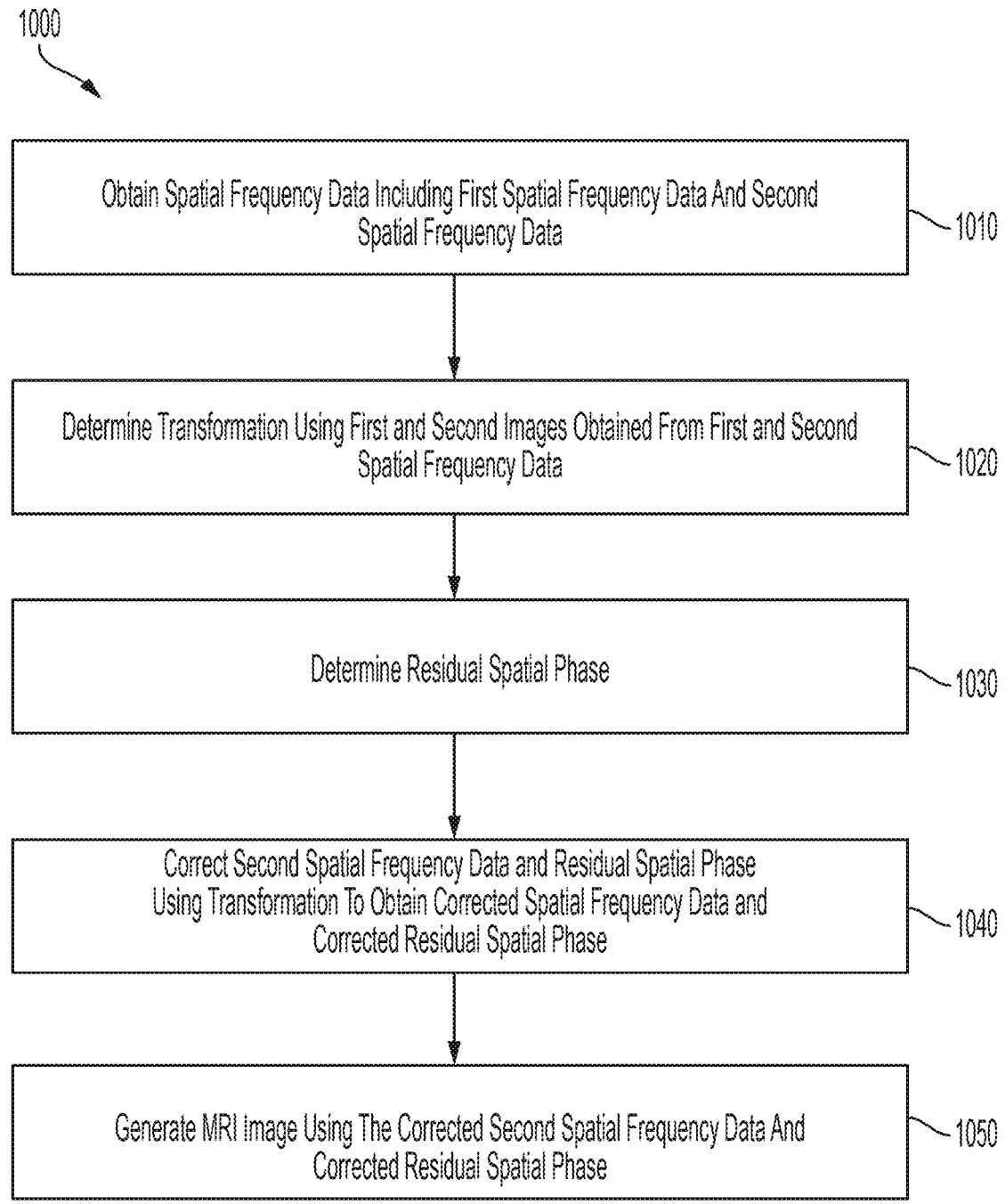
FIG. 10 is a flowchart of an illustrative process 1000 for reconstructing a motion corrected MR image of a subject from sets of spatial frequency data obtained with the subject at different positions, in accordance with some embodiments of the technology described herein.
Figure 11J:
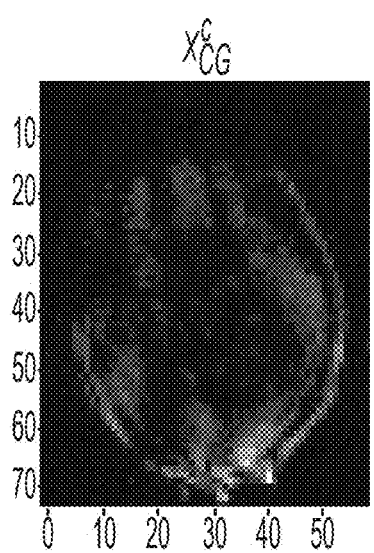
Figure 11K:
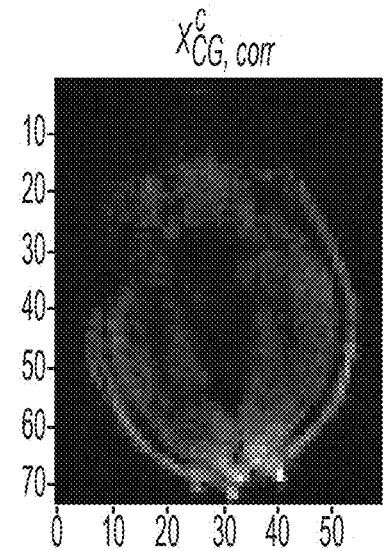

FIG. 10 is a flowchart of an illustrative process 1000 for reconstructing a motion corrected MR image of a subject from sets of spatial frequency data obtained with the subject at different positions, in accordance with some embodiments of the technology described herein. The process 1000 may be performed by any suitable computing device(s). For example, process 1000 may be performed by a computing device part of an MRI system (e.g., the example MRI system described with reference to FIG. 2). As another example, process 1000 may be performed by a computing device external to (e.g., communicatively coupled to) the MRI system. As another example, process 1000 may be performed by at least one computing device part of an MRI system and at least one device external to the MRI system. It should be appreciated that process 1000 may be applied to any number of sets of spatial frequency data obtained at a single position or with each set of spatial frequency data obtained at a different positions, as aspects of the technology described are not limited in this respect.

Process 1000 begins at act 1010, where spatial frequency data (e.g., $(k_0, b_0)$) is obtained. The spatial frequency data may include first spatial frequency data (e.g., $(k_1, b_1)$) and second spatial frequency data (e.g., $(k_2, b_2)$). The first spatial frequency data may correspond to spatial frequency data obtained when the subject was in a first position during imaging. The second spatial frequency data may correspond to spatial frequency data obtained when the subject was in a second position during imaging.

In some embodiments, process 1000 may involve obtaining spatial frequency data and identifying the first and second spatial frequency data within the spatial frequency data. In some embodiments, the first spatial frequency data may be identified as the spatial frequency data collected prior to the subject's motion (e.g., when the subject is in a first position) and the second spatial frequency data may be identified as the spatial frequency data collected subsequent to the subject's motion (e.g., when the subject is in a second position). In some embodiments, the spatial frequency data collected during the subject's motion (e.g., from the first position to the second position) may be removed.

In some embodiments, the first and second spatial frequency may be identified based on additional information indicating a time or times when the subject was moving. The additional information may be obtained by one or more sensors configured to detect and/or track motion of a subject being imaged. The external sensor(s) may be of any suitable type. For example, the external sensor(s) may comprise one or more optical sensors (e.g., one or more cameras), one or more RF sensors, one or more accelerometers and/or gyroscopes, and/or any other suitable type of motion sensor. As one non-limiting example, the external sensor(s) may comprise one or more dipole antennas capacitively coupled to the patient, examples of which are described in U.S. patent application Ser. No. 17/077,850, titled "Systems and Methods for Detecting Patient Motion During Magnetic Resonance Imaging," filed on Oct. 22, 2020 which is incorporated by reference herein in its entirety.

The first and second spatial frequency data may be obtained in any suitable way using any suitable pulse sequence and/or sampling pattern, as aspects of the technology described herein are not limited in this respect. For example, the spatial frequency data may be obtained using any of the sampling path and/or pulse sequences described herein. As another example, the spatial frequency data may be obtained using a Cartesian sampling path or any suitable non-Cartesian sampling path. As yet another example, the spatial frequency data may be obtained using a sampling path that repeatedly samples a central region of k-space containing low spatial-frequency data. Repeatedly collecting low spatial-frequency data may help to reliably estimate the transformation at act 1020, as described next.

Next, at act 1020, a transformation indicative of the motion of the subject between the first and second positions is determined. In some embodiments, the transformation may be determined from the first and second spatial frequency data. For example, in some embodiments, the transformation may be determined by: (1) generating first and second images (e.g., $x_1$, $x_2$) from the first spatial frequency data (e.g., $(k_1, b_1)$) and second spatial frequency data (e.g., $(k_2, b_2)$), respectively; and (2) estimating the transformation T from the first and second images. The first and second images may be generated from the first and second spatial frequency data using any suitable reconstruction technique(s), examples of which are provided herein.

The transformation may be estimated from the first and second images in any suitable way. For example, in some embodiments, the transformation may be a rigid transformation comprising a rotation R matrix and a translation vector t such that:

$$x_2 = Rx_1 + t,$$

and estimating the transformation may comprise estimating the values of R and t (e.g., assuming 6 degrees of freedom) from the data in the images $x_1$ and $x_2$ so that the above equation is satisfies as closely as possible under a suitable choice of metric (mean-squared error, l1-norm, a regularized norm, etc.). It should be appreciated, however, that in some embodiments the transformation need not be limited to a rigid transformation and may be any other suitable type of transformation, as aspects of the technology described herein are not limited in this respect.

Next, at act 1030, the residual spatial phase may be determined. In some embodiments, the residual spatial phase may be determined from the first and second spatial frequency data obtained at act 1010. For example, the residual spatial phase may be determined by: (1) generating a motion-corrupted image $x_c$ from the first and second sets of spatial frequency data (e.g., from $(k_1, b_1)$ and $(k_2, b_2)$, or from $(k_0, b_0)$); and (2) determining the residual spatial phase from the motion-corrupted image. For example, in some embodiments, the angle of the complex motion corrupted image data is used as an approximation of the residual spatial phase, according to:

$$\phi_0 \approx \angle x_c$$

where $\phi_0$ is the residual spatial phase and $x_c$ is the motion-corrupted image. In other embodiments, an estimate of $\phi_0$ may be obtained using a pre-scan or navigator pulse(s).

Next, at act 1040, the second spatial frequency data and the residual spatial phase (e.g., $(k_2, b_2)$) may be corrected using the transformation T obtained at act 1020. As a result, corrected second spatial frequency data $(k^r_2, b^r_2)$ and a corrected residual spatial phase $\phi_0^r$ are obtained. This correction may be performed in any suitable way. For example, the translation t may be applied as a phase shift to the spatial frequency values $b_2$ and the rotation R may be applied as a rotation to the k-space coordinates $k_2$ according to:

$$b_2^r = b_2 \odot e^{ik_2 \cdot t}$$

$$k_2^r = R k_2$$

Next, at act 1050, an MR image may be generated using the corrected second spatial frequency data and corrected residual spatial phase. In some embodiments, the correction may be applied in the image domain, and the MR image may be generated according to:

$$x_{complex,\ corr}^c = |x_1 \odot e^{-i\phi_0} + x_2 \odot e^{-i\phi_0^r}|$$

In other embodiments, the correction may be applied in k-space and the motion corrected image may be generated using an iterative reconstruction technique. For example, in some embodiments, the conjugate gradient sensitivity encoding technique may be used. This technique involves employing coil sensitivity maps that correct for the sensitivity of the coils to the distance between the coils and the subject being imaged. A separate coil sensitivity map may be generated for each set of spatial frequency data, as shown in the following equations:

$$S_1 = \left(S_l \odot e^{-i\phi_0}\right)_{l \in [\![1, N_C]\!]}$$

$$S_2 = \left(S_l \odot e^{-i\phi_0^r}\right)_{l \in [\![1, N_C]\!]}$$

where $S_l$ is the coil sensitivity generated from the motion corrupted spatial frequency data sets or from a prescan, $\phi_0$ is the residual spatial phase, and $\phi_0^r$ is the residual spatial phase of the motion corrected second set of spatial frequency data. Note that the second coil sensitivity map $S_2$ incorporates the corrected residual spatial phase $\phi_0^r$ determined at act 1040.

In some embodiments, following the generation of coil sensitivity maps, the sensing operator A may be generated. For example, the sensing operator may be split into two components designed for each of the two data sets respectively. Each component of the sensing operator A is defined using the coil sensitivity maps $S_1$ and $S_2$, a Fourier operator F, and a pre-whitening matrix W, as shown in the following equation:

$$A = \begin{bmatrix} A_1 \\ A_2 \end{bmatrix} = \begin{bmatrix} W F_{k_1} S_1 \\ W F_{k_2^r} S_2 \end{bmatrix}$$

The adjoint of the sensing operator is given by the following equation:

$$A^* = A_1^* P_1 + A_2^* P_2$$

where $P_1$ and $P_2$ are projectors onto the first set and corrected second set of spatial frequency data, respectively. In turn, the sensing operator, adjoint of the sensing operator, the first spatial frequency data, and the motion corrected second spatial frequency data may be used to generate a motion corrected MR image by solving the matrix inversion problem for $x^c_{CG,\ corr}$, according to:

$$(A^*A + \rho Id) x^c_{CG,\ corr} = A^* \begin{bmatrix} b_1 \\ b_2^r \end{bmatrix}$$

The result from the reconstruction (i.e., $x^c_{CG,\ corr}$) may be output at completion of act 1050 as the MR image that was generated from the spatial frequency data obtained at act 1010 and corrected for motion artefacts.

FIGS. 11J and 11K show a CG-SENSE reconstruction of the spatial frequency data without and with the correction of residual spatial phase according to process 1010 described above. As can be readily seen, the motion-corrected image in FIG. 11K is sharper and has less blurring and other artefacts than the uncorrected version in FIG. 11J.

It should be appreciated that the process 1000 shown in FIG. 10 is illustrative and that there may be variations. For example, in some embodiments, the act 1050 may be optional. For example, in some embodiments, the spatial frequency data collected as part of process 1000 may be stored for later use rather than used to generate at least one MR image as part of process 1000. As another example, multiple sets of spatial frequency data may be obtained and used for prospectively correcting for multiple movements of the subject across multiple different positions.

Prospective Motion Correction

The inventors have also developed techniques for prospective motion correction. Unlike retrospective motion correction techniques, which are used to correct for motion artefacts after all MR imaging data obtained, the prospective motion correction techniques developed by the inventors may be used during MR imaging to compensate for the subject's motion. In some embodiments, MR data collected during MR imaging may be used to determine a transformation corresponding to the subject's motion and, in turn, the transformation may be used to adjust the pulse sequence used for subsequent imaging of the subject. In some embodiments, the pulse sequence may be adjusted by changing the gradient waveforms to be generated by the gradient coils of the MRI system and/or changing the transmit/receive frequency and/or phase of the RF coil(s) of the MRI system.

The technique developed by the inventors involves imaging a patient using a sampling path that repeatedly samples a central region of k-space and using spatial frequency data collected in the central region to estimate the transformation corresponding to the subject's motion. In turn, the transformation may be used to correct the gradient waveforms to be generated by at least one gradient coil of the MRI system and/or change the transmit/receive frequency and/or phase of at least one RF coil of the MRI system.

Accordingly some embodiments are directed to techniques of prospectively compensating for motion of a subject being imaged by an MRI system, the MRI system comprising a plurality of magnetics components including at least one gradient coil and at least one radio-frequency (RF) coil, the method comprising: (1) obtaining first spatial frequency data and second spatial frequency data by operating the MRI system in accordance with a pulse sequence, wherein the pulse sequence is associated with a sampling path that repeatedly samples (e.g., includes at least two non-contiguous portions each for sampling) a central region of k-space (e.g., sometimes termed a "keyhole" region); (2) determining a transformation (e.g., a rigid transformation comprising a rotation and/or a translation) using a first image obtained using the first spatial frequency data (which, for example, may include data collected by visiting the central region multiple times) and a second image obtained using the second spatial frequency data (which, for example, may include data collected by vising the central region multiple times); (3) correcting the pulse sequence using the determined transformation to obtain a corrected pulse sequence; and (4) obtaining additional spatial frequency data in accordance with the corrected pulse sequence.

In some embodiments, the method further comprises generating at least one magnetic resonance (MR) image using the additional spatial frequency data.

In some embodiments, the additional spatial frequency data may include collecting spatial frequency data for k-space coordinates that were going to be sampled by the pulse sequence, but these samples will now be collected in the motion-corrected coordinate system by using the corrected pulse sequence. Additionally or alternatively, the additional spatial frequency data may include collecting spatial frequency data at new k-space coordinates, as aspects of the technology described herein are not limited in this respect.

In some embodiments, the central region of k-space is a region located entirely within a threshold distance of an origin of k-space. In some embodiments, the central region comprises a two-dimensional (2D) elliptical, circular, rectangular, and/or square region that includes an origin of k-space.

In some embodiments, the sampling path comprises multiple non-contiguous sub-paths containing k-space phase-encoding coordinates in the central region. Two sub-paths of a sampling path may be non-contiguous when there is at least one point not part of either of the two sub-paths and located between the two sub-paths along the sampling path.

In some embodiments, the pulse sequence comprises a gradient waveform, correcting the pulse sequence comprises determining a corrected gradient waveform from the gradient waveform by using the determined transformation, and obtaining the additional spatial frequency data in accordance with the corrected pulse sequence comprises operating the MRI system in accordance with the corrected gradient waveform. In some embodiments, the transformation comprises a rotation and wherein determining the corrected gradient waveform comprises applying the rotation to the gradient waveform. In some embodiments, the transformation comprises a translation, and wherein correcting the pulse sequence comprises changing transmit frequency of the at least one RF coil and/or receive phase of the at least one RF coil.

In some embodiments, generating at least one magnetic resonance (MR) is performed using first spatial frequency data, the second spatial frequency data, and the additional spatial frequency data. The MR image(s) may be generated using any suitable reconstruction techniques, examples of which are provided herein. For example, the MR image(s) may be generated using any suitable iterative reconstruction techniques, examples of which are provided herein.

Figure 12:
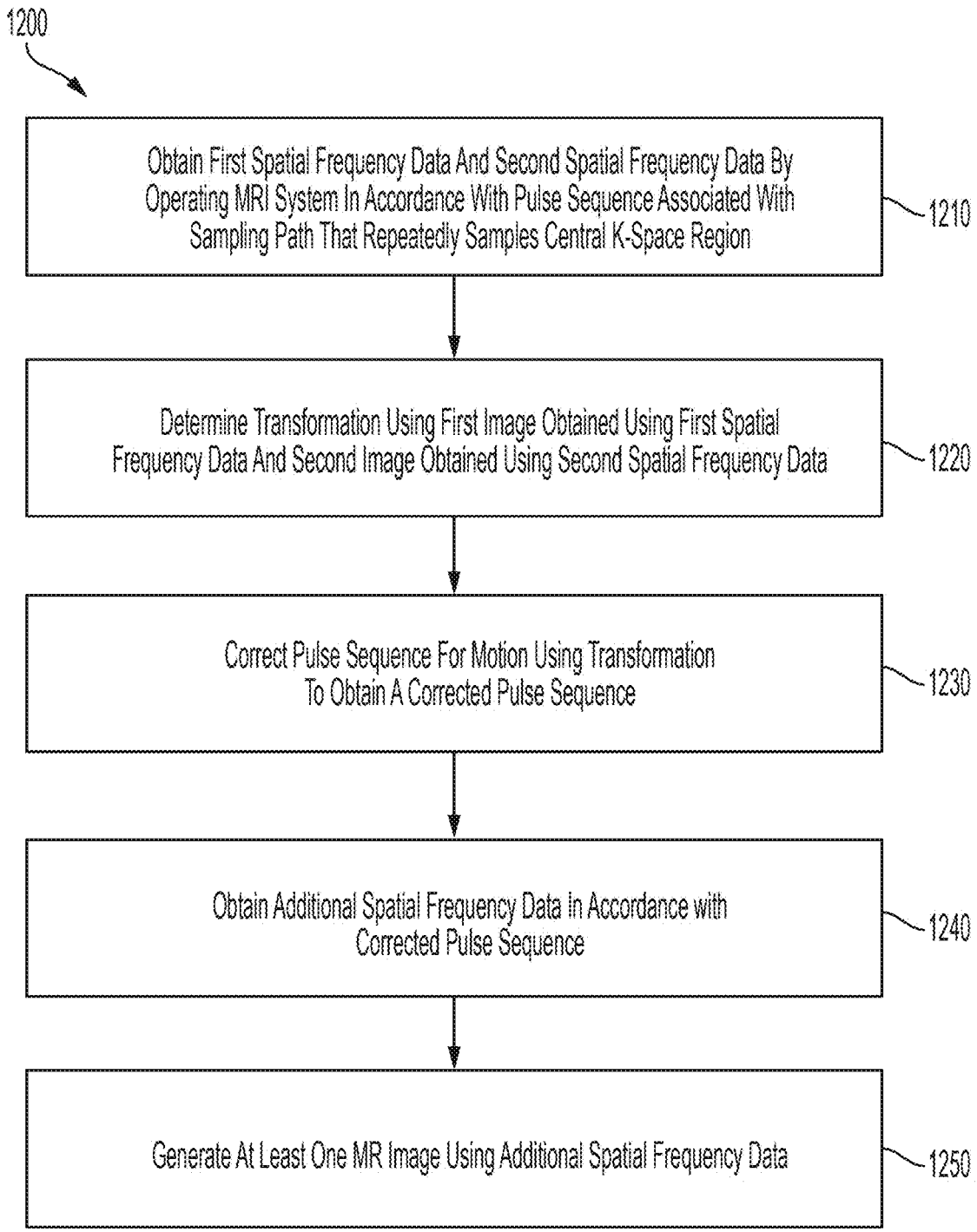
FIG. 12 is a flowchart of an illustrative process 1200 for prospective motion correction during MRI imaging, in accordance with some embodiments of the technology described herein.

FIG. 12 is a flowchart of an illustrative process 1200 for prospective motion correction during MRI imaging. In particular, process 1200 may be employed, while a subject is being imaged by an MRI system (e.g., a low-field MRI system or any other type of MRI system), to compensate the pulse sequence being used by the MRI sequence to perform imaging in order to compensate for the subject's motion. In some embodiments, the process 1200 may be performed by the MRI system. In some embodiments, one or more of the acts of process 1200 (e.g., acts 1210, 1220, and/or 1250) may be performed by at least one computing device external to the MRI system.

Process 1200 begins at act 1210, first spatial frequency data and second spatial frequency data are obtained. In some embodiments, the first and second spatial frequency data may have been obtained by an MRI system using a pulse sequence associated with a sampling path that repeatedly samples a central k-space region. For example, the first spatial frequency data may include spatial frequency data obtained by repeatedly sampling the central k-space region. As another example, the second spatial frequency data may include spatial frequency data obtained by repeatedly sampling the central k-space region. Repeatedly collecting low spatial-frequency data in the central k-space region may help to reliably estimate the transformation at act 1220, as described below. In some embodiments, the sampling path utilized to obtain the first and second spatial frequency data may be a Cartesian sampling path or any suitable non-Cartesian sampling path.

In some embodiments, the first spatial frequency data may correspond to spatial frequency data obtained when the subject was in a first position during imaging, and the second spatial frequency data may correspond to spatial frequency data obtained when the subject was in a second position during imaging.

In some embodiments, process 1200 may involve obtaining a set of spatial frequency data and identifying the first and second spatial frequency data within the spatial frequency data. In some embodiments, the first spatial frequency data may be identified as the spatial frequency data collected prior to the subject's motion and the second spatial frequency data may be identified as the spatial frequency data collected subsequent to the subject's motion. In some embodiments, the spatial frequency data collected during the subject's motion may be removed.

In some embodiments, the first and second spatial frequency data may be identified based on additional information indicating a time or times when the subject was moving. The additional information may be obtained by one or more sensors configured to detect and/or track motion of a subject being imaged. The external sensor(s) may be of any suitable type. For example, the external sensor(s) may comprise one or more optical sensors (e.g., one or more cameras), one or more RF sensors, one or more accelerometers and/or gyroscopes, one or more dipole antennas capacitively coupled to the subject, and/or any other suitable type of motion sensor.

Next, at act 1220, a transformation indicative of the motion of the subject between the first and second positions is determined. In some embodiments, the transformation may be determined from the first and second spatial frequency data. For example, in some embodiments, the transformation may be determined by: (1) generating first and second images (e.g., $x_1$, $x_2$) from the first spatial frequency data (e.g., $(k_1, b_1)$) and second spatial frequency data (e.g., $(k_2, b_2)$), respectively; and (2) estimating the transformation T from the first and second images. The first and second images may be generated from the first and second spatial frequency data using any suitable reconstruction technique(s), examples of which are provided herein.

The transformation may be estimated from the first and second images in any suitable way. For example, in some embodiments, the transformation may be a rigid transformation comprising a rotation R matrix and a translation vector t such that:

$$x_2 = RX_1 + t,$$

and estimating the transformation may comprise estimating the values of R and t (e.g., assuming 6 degrees of freedom) from the data in the images $x_1$ and $x_2$ so that the above equation is satisfies as closely as possible under a suitable choice of metric (correlation, mean-squared error, l1-norm, a regularized norm, etc.). It should be appreciated, however, that in some embodiments the transformation need not be limited to a rigid transformation and may be any other suitable type of transformation, as aspects of the technology described herein are not limited in this respect.

Next, at act 1230, the pulse sequence used for imaging the subject may be corrected for the subject's motion by using the transformation determined at act 1220. This may be done in any suitable way. For example, in some embodiments, the pulse sequence comprises a gradient waveform, and correcting the pulse sequence comprises determining a corrected gradient waveform. In some embodiments, the transformation comprises a rotation and determining the corrected gradient waveform comprises applying the rotation to the gradient waveform. In some embodiments, the transformation comprises a translation, and wherein correcting the pulse sequence comprises changing transmit frequency of the at least one RF coil and/or receive phase of the at least one RF coil. Aspects of such calculations are described in J. Maclaren, M. Herbst, O. Speck, and M. Zaitsev, "Prospective motion correction in brain imaging: A review", Magnetic Resonance in Medicine, Volume 69, Issue 23, Mar. 1, 2013, pp. 621-636, which is incorporated by reference herein in its entirety.

Next, at act 1240, the MRI system obtains additional spatial frequency data in accordance with the corrected pulse sequence obtained at act 1230. Obtaining additional spatial frequency data may involve collecting spatial frequency data for k-space coordinates that were going to be sampled by the pulse sequence, but these samples will now be collected in the motion-corrected coordinate system by using the corrected pulse sequence obtained at act 1230. Additionally or alternatively, the additional spatial frequency data may include collecting spatial frequency data at new k-space coordinates, as aspects of the technology described herein are not limited in this respect.

Next, at act 1250, the MRI system generates at least one MR image using at least some (e.g., all) of the additional spatial frequency data obtained at act 1240. In some embodiments, the at least one MR image may include multiple MR images (e.g., multiple 2D slices). The additional spatial frequency data obtained at act 1240 may be used alone or in combination with other spatial frequency data (e.g., spatial frequency data obtained by the MRI system prior to act 1240, for example, by using the uncorrected pulse sequence) to generate the at least one MR image. The at least one MR image may be generated using any suitable reconstruction technique, examples of which are provided herein, as aspects of the technology described herein are not limited in this respect.

It should be appreciated that the process 1200 shown in FIG. 12 is illustrative and that there may be variations. For example, in some embodiments, the act 1250 may be optional. For example, in some embodiments, the spatial frequency data collected as part of process 1200 may be stored for later use rather than used to generate at least one MR image as part of process 1200. As another example, multiple sets of spatial frequency data may be obtained and used for prospectively correcting for multiple movements of the subject across multiple different positions.

Additional Implementation Detail

Figure 13:
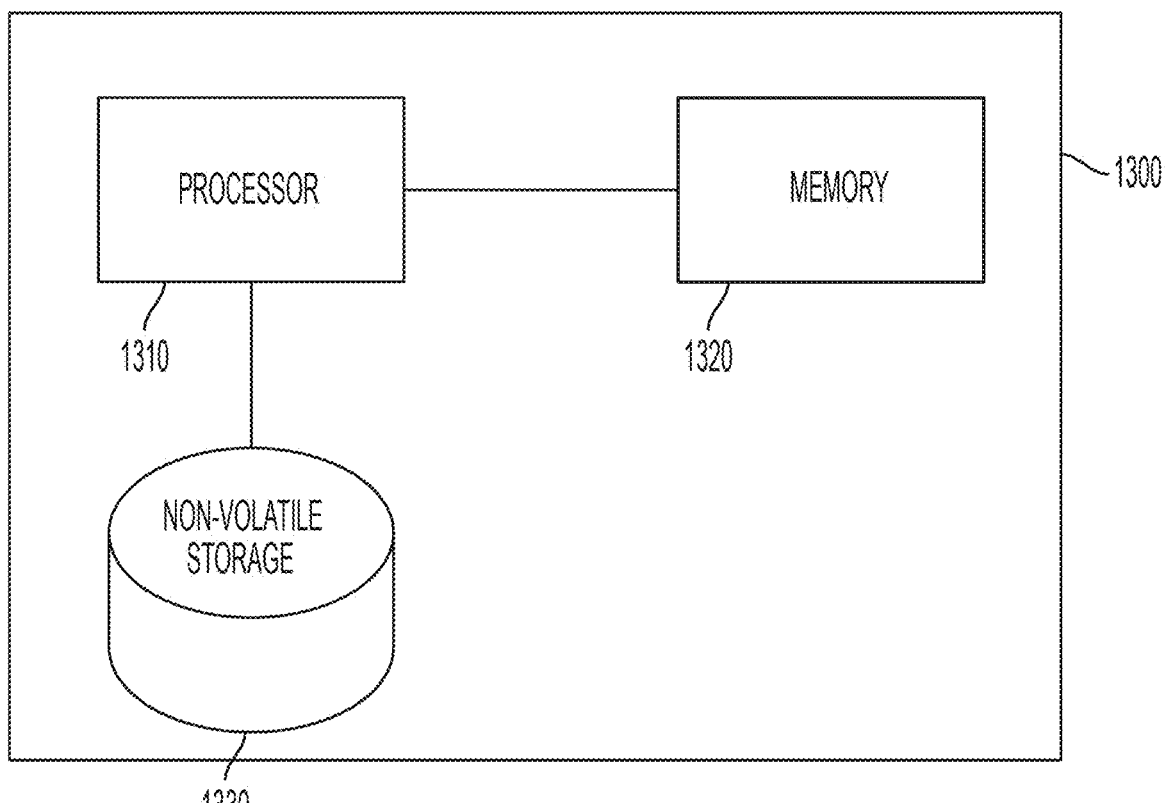
FIG. 13 is a diagram of an illustrative computer system on which embodiments described herein may be implemented.

FIG. 13 is a diagram of an illustrative computer system on which embodiments described herein may be implemented. An illustrative implementation of a computer system 1300 that may be used in connection with any of the embodiments of the disclosure provided herein is shown in FIG. 13. For example, the processes described with reference to FIGS. 3A, 3B, 10, and 12 (or at least parts thereof) may be implemented on and/or using computer system 1300. The computer system 1300 may include one or more processors 1310 and one or more articles of manufacture that comprise non-transitory computer-readable storage media (e.g., memory 1320 and one or more non-volatile storage media 1330). The processor 1310 may control writing data to and reading data from the memory 1320 and the non-volatile storage device 1330 in any suitable manner, as the aspects of the disclosure provided herein are not limited in this respect. To perform any of the functionality described herein, the processor 1310 may execute one or more processor-executable instructions stored in one or more non-transitory computer-readable storage media (e.g., the memory 1320), which may serve as non-transitory computer-readable storage media storing processor-executable instructions for execution by the processor 1310.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize or be able to ascertain using no more than routine experimentation many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone, a tablet, or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The terms "approximately," "substantially," and "about" may be used to mean within ±20% of a target value in some

The invention claimed is:

1. A method comprising:
    obtaining spatial frequency data by operating an MRI system in accordance with a pulse sequence;
    identifying, from the spatial frequency data and based on information indicating a time or times of movement of a subject being imaged by the MRI system, first spatial frequency data and second spatial frequency data;
    determining a transformation using a first image obtained using the first spatial frequency data and a second image obtained using the second spatial frequency data;
    correcting the pulse sequence using the determined transformation to obtain a corrected pulse sequence; and
    obtaining additional spatial frequency data in accordance with the corrected pulse sequence.

2. The method of claim 1, further comprising: generating at least one magnetic resonance (MR) image using the additional spatial frequency data.

3. The method of claim 2, wherein generating the at least one MR image is performed using the first spatial frequency data, the second spatial frequency data, and the additional spatial frequency data.

4. The method of claim 2, wherein generating the at least one MR image is performed using an iterative reconstruction technique.

5. The method of claim 1, wherein the pulse sequence is associated with a sampling path that includes at least two non-contiguous portions each for sampling a central region of k-space.

6. The method of claim 5, wherein the central region of k-space is a region located entirely within a threshold distance of an origin of k-space.

7. The method of claim 5, wherein the central region comprises a two-dimensional (2D) elliptical, circular, rectangular, and/or square region that includes an origin of k-space.

8. The method of claim 5, wherein the sampling path comprises multiple noncontiguous sub-paths containing k-space phase-encoding coordinates in the central region.

9. The method of claim 1, wherein the transformation is a rigid transformation.

10. The method of claim 1, wherein the transformation comprises a rotation and a translation.

11. The method of claim 1,
    wherein the pulse sequence comprises a gradient waveform,
    wherein correcting the pulse sequence comprises determining a corrected gradient waveform from the gradient waveform by using the determined transformation, and
    wherein obtaining the additional spatial frequency data in accordance with the corrected pulse sequence comprises operating the MRI system in accordance with the corrected gradient waveform.

12. The method of claim 11,
    wherein the transformation comprises a rotation, and
    wherein determining the corrected gradient waveform comprises applying the rotation to the gradient waveform.

13. The method of claim 1,
    wherein the transformation comprises a translation, and
    wherein correcting the pulse sequence comprises changing transmit frequency of the at least one RF coil and/or receive phase of the at least one RF coil.

14. The method of claim 1, wherein the method prospectively compensates for motion of the subject being imaged by the MRI system, the MRI system comprising a plurality of magnetics components including at least one gradient coil and at least one radio-frequency (RF) coil.

15. A magnetic resonance imaging (MRI) system comprising:
    at least one controller configured to perform:
        controlling the MRI system in accordance with an MRI pulse sequence to obtain spatial frequency data;
        identifying, from the spatial frequency data and based on information indicating a time or times of movement of a subject, first spatial frequency data and second spatial frequency data;
        determining a transformation using a first image obtained using the first spatial frequency data and a second image obtained using the second spatial frequency data;
        correcting the pulse sequence using the determined transformation to obtain a corrected pulse sequence; and
        controlling the MRI system to obtain additional spatial frequency data in accordance with the corrected pulse sequence.

16. The MRI system of claim 15, wherein the at least one controller is further configured to perform:
    generating at least one magnetic resonance (MR) image using the additional spatial frequency data.

17. The MRI system of claim 15, wherein the pulse sequence is associated with a sampling path that repeatedly samples a central region of k-space, wherein the central region of k-space is a region located entirely within a threshold distance of an origin of k-space, wherein the sampling path comprises multiple non-contiguous sub-paths containing k-space phase-encoding coordinates in the central region, and wherein the transformation comprises a rotation and a translation.

18. The MRI system of claim 15,
    wherein the pulse sequence comprises a gradient waveform,
    wherein correcting the pulse sequence comprises determining a corrected gradient waveform from the gradient waveform by using the determined transformation, and
    wherein obtaining the additional spatial frequency data in accordance with the corrected pulse sequence comprises operating the MRI system in accordance with the corrected gradient waveform.

19. The MRI system of claim 18, wherein determining the corrected gradient waveform comprises applying a rotation to the gradient waveform.

20. The MRI system of claim 15, further comprising:
    a plurality of magnetics components including:
        at least one gradient coil; and
        at least one RF coil;
    wherein correcting the pulse sequence comprises changing transmit frequency of the at least one RF coil and/or receive phase of the at least one RF coil.

* * * * *